United States Patent
Tanzawa et al.

(10) Patent No.: US 6,856,548 B2
(45) Date of Patent: Feb. 15, 2005

(54) NONVOLATILE SEMICONDUCTOR MEMORY

(75) Inventors: Toru Tanzawa, Ebina (JP); Tadayuki Taura, Zushi (JP); Masao Kuriyama, Fujisawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/756,267

(22) Filed: Jan. 14, 2004

(65) Prior Publication Data

US 2004/0141378 A1 Jul. 22, 2004

Related U.S. Application Data

(62) Division of application No. 10/198,170, filed on Jul. 19, 2002, now Pat. No. 6,711,066, which is a continuation of application No. 09/812,572, filed on Mar. 21, 2001, now Pat. No. 6,442,080, which is a continuation of application No. 09/527,513, filed on Mar. 16, 2000, now Pat. No. 6,236,609.

(30) Foreign Application Priority Data

Mar. 18, 1999 (JP) ............................................ 11-074039
Mar. 18, 1999 (JP) ............................................ 11-074045

(51) Int. Cl.$^7$ ............................................... G11C 11/40
(52) U.S. Cl. ............................ 365/185.22; 365/185.18; 365/185.3; 365/185.29
(58) Field of Search ....................... 365/185.22, 185.18, 365/185.3, 185.29, 185

(56) References Cited

U.S. PATENT DOCUMENTS

| | | | |
|---|---|---|---|
| 5,237,535 | A | 8/1993 | Mielke et al. |
| 5,568,419 | A | 10/1996 | Atsumi et al. |

(List continued on next page.)

OTHER PUBLICATIONS

S. Yamada et al., "A Self–Convergence Erasing Scheme For A Simple Stacked Gate Flash EEPROM", pp. 11.4.1–11.4.4.
H. Shiga et al., "A Sampling Weak–Program Method to Tighten Vth–distribution of 0.5V for Low–Voltage Flash Memories", 1995, pp. 33–36.

Primary Examiner—Viet Q. Nguyen
(74) Attorney, Agent, or Firm—Banner & Witcoff, LTD.

(57) ABSTRACT

A potential generating circuit generates two types of erase verify threshold values EVT1 and EVT2. These values satisfy the relationship of EVT2=EVT1+(OEVT–EVTL). OEVT is an over-erase verify threshold value. While the erase verify threshold value is set at EVT2, the lower limit of a threshold voltage distribution after data erase is higher than OEVT. EVTL is the lower limit of the threshold voltage distribution after data erase while the erase verify threshold value is set at EVT1 and is lower than OEVT. The erase verify threshold values EVT1 and EVT2 are switched according to an operation mode. During a write/erase test, for example, the erase verify threshold value is set at EVT2. On the other hand, during the normal operation, the erase verify threshold value is set at EVT1.

11 Claims, 25 Drawing Sheets

U.S. PATENT DOCUMENTS

| | | | |
|---|---|---|---|
| 5,859,799 A | 1/1999 | Matsumoto et al. | |
| 5,926,430 A | 7/1999 | Noda et al. | |
| 6,002,630 A | 12/1999 | Chuang et al. | |
| 6,038,165 A * | 3/2000 | Miwa et al. | 365/185.03 |
| 6,108,263 A * | 8/2000 | Bauser et al. | 365/230.01 |
| 6,122,193 A * | 9/2000 | Shibata et al. | 365/185.03 |
| 6,172,917 B1 * | 1/2001 | Kataoka et al. | 365/189.05 |
| 6,236,609 B1 | 5/2001 | Tanzawa et al. | |
| 6,246,625 B1 | 6/2001 | Yamagata et al. | |
| 6,278,316 B1 | 8/2001 | Tanzawa et al. | |
| 6,292,399 B1 | 9/2001 | Le et al. | |
| 6,314,027 B1 | 11/2001 | Choi | |
| 6,331,945 B1 * | 12/2001 | Shibata et al. | 365/185.03 |
| 6,373,748 B2 * | 4/2002 | Ikehashi et al. | 365/185.22 |
| 6,418,052 B1 * | 7/2002 | Shibata et al. | 365/185.12 |
| 6,442,080 B2 | 8/2002 | Tanzawa et al. | |
| 6,483,752 B2 | 11/2002 | Hirano | |
| 6,515,908 B2 | 2/2003 | Miyawaki et al. | |
| 6,567,316 B1 | 5/2003 | Ohba et al. | |
| 6,714,459 B2 * | 3/2004 | Hirano | 365/185.3 |
| 2001/0050377 A1 * | 12/2001 | Ikehashi et al. | 257/200 |
| 2002/0008996 A1 | 1/2002 | Hirano | |
| 2002/0141237 A1 | 10/2002 | Goda et al. | |
| 2002/0181292 A1 | 12/2002 | Tanzawa et al. | |

* cited by examiner

NONVOLATILE SEMICONDUCTOR MEMORY

CROSS-REFERENCE TO RELATED APPLICATIONS

This application is a divisional of prior application Ser. No. 10/198,170, filed Jul. 19, 2002, now U.S. Pat. No. 6,711,066 which is a continuation of prior application Ser. No. 09/812,572, filed Mar. 21, 2001 (now U.S. Pat. No. 6,442,080), which is a continuation of prior application Ser. No. 09/527,513, filed Mar. 16, 2000 (now U.S. Pat. No. 6,236,609), which is based upon and claims the benefit of priority from the prior Japanese Patent Applications No. 11-074039, filed Mar. 18, 1999; and No. 11-074045, filed Mar. 18, 1999, the entire contents of which are incorporated herein by reference.

BACKGROUND OF THE INVENTION

The present invention relates to a nonvolatile semiconductor memory particularly used as a NOR-type flash EEPROM.

A NOR-type flash EEPROM has three basic modes, i.e., a program mode, an erase mode and a read mode. In the program mode, for example, operation for raising the threshold voltage of a memory cell up to not less than a predetermined value (e.g., 5.5V) is carried out. In the erase mode, operation for setting the threshold voltage of a memory cell to fall within a predetermined range (e.g., 0.5 to 3.0V) is carried out.

In case of a NOR-type flash EEPROM having an auto-program function and an auto-erase function, in the program mode, for example, it is verified whether or not the threshold voltage of a memory cell is not less than 5.5V and reprogram (rewrite) is automatically carried out until the threshold voltage of the memory cell becomes not less than 5.5V. In the erase mode, it is verified whether or not the threshold voltage of a memory cell is within a range of 0.5 to 3.0V and predetermined operation is carried out automatically until the threshold voltage of the memory cell falls within the predetermined range.

FIG. 1 shows the important parts of a conventional NOR-type flash EEPROM.

A memory cell array 11 consists of a plurality of blocks. Each block has a plurality of memory cells connected between word lines (input side) and bit lines (output side) to form a NOR relationship.

External addresses A1 to A17 are input to a multiplexer 13 either directly or through an address register 12. An address counter 16 generates internal addresses. The multiplexer 13 feeds either an external address or an internal address to a row decoder 14 and a column decoder 15.

Input data is fed to a data input register 18 and a command register 19 through an input/output buffer 17. The data of the data input register 18 is supplied to memory cells through a column selecting circuit 20.

The command register 19 recognizes a command consisting of an address and a data and outputs a control signal to the address register 12, the multiplexer 13, the data input register 18 and a control circuit 21 in response to the command.

The control circuit 21 recognizes an operation mode to be executed next based on the control signal output from the command register 19.

A potential generating circuit 22 generates various potentials corresponding to operation modes. The potential generated by the potential generating circuit 22 is applied to the control gates and the bit lines of the memory cells in each operation mode.

A verify circuit 23 verifies whether or not data program or data erase is surely carried out to a selected memory cell and outputs a result, i.e., VERIOK to the control circuit 21.

A final address detecting circuit 24 outputs a detection signal AEND indicating whether or not the final address of each block of the memory cell array 11 is detected and outputs a detection signal BEND indicating whether or not the final block of the memory cell array 11 is detected.

A timer 25 counts the number of program operations or the number of erase operations conducted to the selected memory cell. The timer 25 outputs a time out signal TIME OUT to the control circuit 21 when the number of program operations or that of erase operations conducted to the selected memory cell reaches a predetermined number.

A clock generating signal 26 generates a clock for controlling the internal operation of the flash EEPROM based on a write enable signal $\overline{WE}$, a chip enable signal $\overline{CE}$, an output enable signal $\overline{OE}$ and the like.

FIG. 2 shows the memory cell array of the NOR-type flash EEPROM shown in FIG. 1. FIGS. 3 to 5 show the device structure of a portion enclosed by a broken line X in FIG. 2.

In this example, memory cells are formed in a twin well, i.e., a P-type twin well 112 in an N-type well 111 in a P-type silicon substrate 110.

As an element separation insulating film, a field oxide film 113, for example, is formed above the silicon substrate 110. A silicon oxide film 114, which serves as a gate insulating film, is formed on an element region surrounded by the field oxide film 113. A floating gate electrode 115 is formed on the silicon substrate 114. A control gate electrode (word line) 117 (WL) is formed above the floating gate electrode 115 through a silicon oxide film 116.

An N-type source region 121 and an N-type drain region 122 are formed in the silicon substrate 110 on both sides of the floating gate electrode 115 and the control gate electrode 117. In this case, the source regions (source lines SL's) of all memory cells, for example, are mutually connected.

A silicon oxide film 118 entirely covering memory cells MC's are formed on the memory cells MC's. A contact hole 120 which reaches a drain region 122 is provided in the silicon oxide film 118. A bit line 119 (BL) is formed on the silicon oxide film 118. The bit line 119 contacts with the drain region 122 through the contact hole 120 of the silicon oxide film 118.

Next, description will be given to potentials applied to memory cells in each of the program mode, the read mode and the erase mode of the above-stated NOR-type flash EEPROM.

First, in the program mode, the potential of a selected word line WL is set at, for example, Vpp (e.g., a high potential such as about 10V) and that of an unselected word line WL is set at Vss (e.g., 0V). The potential of a bit line BL to which a memory cell (selected cell), for which "0"-programming is conducted, is connected is set at Vss (e.g., 0V). The potential of a bit lines BL to which a memory cell (unselected cell), for which "1"-programming is conducted, is connected is set at Vss (e.g., 0V). The potential of a source line SL is Vss (e.g., 0V).

At this moment, in the selected cell, the potential of a control gate (word line) is Vpp, that of a drain is Vdp and that of a source is Vss, so that electrons within the source are accelerated and moved to the drain. They become electrons (hot electrons) with high energy in a channel in the vicinity of the drain and are moved into the floating gate by an electric field between the control gate and the channel. Due to this, the threshold voltage of the selected cell increases and "0"-programming is carried out in the cell.

In the unselected cell, on the other hand, the potential of a control gate (word line) is Vpp and those of a drain and a source are Vss, so that no current flows between the drain and the source. Due to this, the threshold voltage of the unselected cell does not increase and "1"-programming is carried out (an erase state is maintained) in the cell.

Next, in the read mode, the potential of the selected word line WL is set at, for example, Vcc (e.g., a potential of about 5V) and that of the unselected word line WL is set at, for example, Vss (e.g., 0V). The bit line BL to which the memory cell (selected cell), for which data read is carried out, is pre-charged with Vd (e.g. a potential of about 1V) and then turned into a floating state. The potential of the bit line BL to which the memory cell (unselected cell), for which no data read is carried out, is set at, for example, Vss (e.g., 0V). The potential of the source line SL is set at, for example, Vss (e.g., 0V).

The threshold voltage of the memory cell (in a "1" state) storing data "1" is lower than Vcc, whereas that of the memory cell (in a "0" state) storing data "0" is higher than Vcc. Due to this, if the potential of the selected word line WL is set at Vcc, the cell in the "1" state is turned on and that in the "0" state is turned off.

Accordingly, a current flows into the cell in the "1" state and the potential of the bit line BL to which this cell is connected is decreased to Vss. No current flows into the cell in the "0" state and the potential of the bit line BL to which this cell is connected, is, therefore, maintained Vd. Data read is executed if a sense amplifier senses the potential change of this bit line BL.

Next, description will be given to potentials applied to memory cells in the erase mode.

Data erase is carried out in units of blocks and simultaneously carried out to all memory cells in each block. A mode for erasing the data of the memory cells in one or a plurality of blocks in a chip is referred to as "a block erase mode" and a mode for erasing the data of the memory cells in all blocks in the chip is referred to as "a chip erase mode".

In the erase mode, the potentials of all the word lines WL's in the chip are set at, for example, Vss (e.g., 0V). The potentials of the twin wells (i.e., the P-type well and the N-type well) in a selected block are set at, for example, Vee (e.g., a high potential of about 20V) and those of the twin wells in an unselected block are set at, for example, Vss (e.g., 0V). It is noted that the twin wells are provided per block.

At this moment, in each of the memory cells in the selected block, the potential of the control gate (word line) is Vss and those of the twin wells (channel) are Vee, so that a high electric field is applied to the gate oxide film. Due to this, electrons within the floating gate are moved to the twin wells (channel) by an FN tunnel phenomenon. As a result, the threshold voltages of the memory cells in the selected block are decreased and the memory cells are turned into a "1" state (data erase is carried out in the cells).

On the other hand, in each of the memory cells in the unselected block, the potential of the control gate (word line) and those of the twin wells (channel) are set at Vss, so that no high electric field is applied to the gate oxide film. As a result, the memory cells in the unselected block have no change in electron quantity in the floating gate, i.e., no change in threshold voltages and data erase is not, therefore, carried out in the cells.

In the meantime, the NOR-type flash EEPROM has conventionally the following disadvantages in the erase mode.

Memory cells in a block have individual erase characteristics due to manufacturing process or the like. In some cases, the memory cells in the block for which data erase is carried out have individual initial threshold voltages.

These differences in erase characteristics and initial threshold voltage cause the memory cells in the block after block erase is carried out, to have individual threshold voltages and a threshold voltage distribution is formed. Owing to this, when, for example, data erase is completed for all the memory cells in a block, that is, when data erase is completed for the memory cell having the worst erase characteristics in the block (memory cell having the slowest erase speed), the memory cell having the best erase characteristics in the block (memory cell having the fastest erase speed) may turn into an over-erase state.

The over-erase state means that the threshold voltage of a memory cell becomes a negative value. Such an over-erase state of the memory cell causes a significant problem in the read mode. That is to say, in the read mode, the potential of the selected word line WL is set at Vcc (e.g., a potential of about 5V) and that of the unselected word line WL is set at Vss (e.g., 0V) as already described above.

All the memory cells connected to the unselected word lines WL's are turned off, those connected to the selected word line WL are turned on or off according to their states ("1" or "0") and the potential change of the bit line is detected, thereby carrying out data read.

The unselected memory cell in the over-erase state (which threshold voltage is a negative value) is not turned off but turned on even if a potential of Vss (0V) is applied to the control gate (word line) thereof. Thus, the potentials of the bit line BL to which the unselected memory cell in the over-erase state is connected, is always decreased due to discharge (leak), resulting in a read error, i.e., even if the selected cell is in the "0" state, data "1" is read to the bit line.

To prevent the over-erase of the memory cell, there is known an erase technique which has an erase sequence including not only an erase step but also a pre-program step and a convergence step.

In the pre-program step, the threshold voltages of memory cells, to which data erase is conducted, are made uniform, whereby the probability that memory cells in the over-erase state occur after the erase step is intended to be decreased. In the convergence step, if a memory cell in the over-erase state occurs, then a weak program is carried out to the memory cell, the threshold voltage of the memory cell in the over-erase state is returned to a predetermined voltage and a threshold voltage distribution after the erase step is intended to converge.

Needless to say, in each of the pre-program, erase and convergence operations, a verify operation is performed after each operation to verify whether or not the operation is completely carried out.

Next, a concrete example of the erase sequence will be described.

FIG. 6 shows an example of the erase sequence. It is noted that each of the circuits referred to in the following description is that shown in FIG. 1.

If the command register 19 confirms an erase command and the block of the memory cell array 11 for which an erase operation is executed, the control circuit 21 controls the operations of the respective circuits in the chip so as to execute the erase sequence shown in FIG. 6.

First, after the address counter 16, the timer 25 and the like are reset, a pre-program step is executed for memory cells in a selected block (in steps ST1 to ST2).

The pre-program step is executed according to procedures shown in the sub-routine of FIG. 7.

First, the address Add of the address counter 16 is set at an initial value "0" and the numerical value Cycle of the timer 25 (corresponding to the number of program steps) is set at an initial value "0" (in steps ST41 to ST42). In the potential generating circuit 22, internal power supply for program verify P. V. is set up (in step ST43).

Thereafter, the data of a memory cell selected by the address Add is read (in step ST44). The data of the memory cell (selected cell) selected by the address Add is compared with program data "0" (in step ST45).

That is, it is assumed that a potential (a program verify threshold value) PVT (e.g., 5.5V) which is the lower limit of the threshold values with which it can be determined that a memory cell is in a program state, is a boundary value. If the threshold value of the selected cell is higher than the boundary value, it is determined that the data of the selected cell is "0". If the threshold value of the selected cell is lower than the boundary value, it is determined that the data of the selected cell is "1".

If the data of the selected cell does not coincide with the program data "0", program NG is determined and a data program step (injection of electrons into the floating gate) is executed to the selected cell.

This data program step is repeatedly carried out until the Cycle or the number of program steps reaches a preset number Limit and the data of the selected cell coincides with the program data "0" (in steps ST48 to ST49).

When the Cycle or the number of program steps for the selected cell reaches the preset number Limit, the pre-program step is ended even if the data of the selected cell does not coincide with the program data (in step ST46).

At this moment, a signal ERROR indicating that a program error occurs is set at "1" (in step ST47).

On the other hand, if the data of the selected cell coincides with the program data "0", program OK is determined and the address Add is advanced by one, whereby the same operation is carried out to a memory cell (selected cell) at the next address. At this moment, the numerical value of the timer 25 is reset at the initial value (in steps ST42 and ST51).

When the data of the selected cell coincides with the program data "0" and the address Add corresponds to the final address in the block, the pre-program step is ended. In that case, the threshold voltage distribution of the memory cells in the selected block is that shown in FIG. 8 (in step ST50).

Next, it is checked whether or not the signal ERROR indicating the presence of a program error is "1". If a program error occurs, that is, the signal ERROR is "1", then the erase operation is ended (in step ST3).

If the pre-program is surely executed, that is, the signal ERROR is "0", an erase step is executed (in step ST4).

The erase step is executed according to procedures shown in the sub-routine of FIG. 9.

First, the address Add of the address counter 16 is set at the initial value "0" and the numerical value Cycle of the timer 25 (corresponding to the number of erase steps) is set at the initial value "0" (in steps ST61 to ST62). In the potential generating circuit 22, internal power supply for the erase verify E. V. is set up (in step ST63).

Thereafter, the data of a memory cell selected by the address Add is read (in step ST64). The data of the memory cell (selected cell) selected by the address Add is compared with an expected value "1" (in step ST65).

That is, it is assumed that a potential (erase verify threshold value) EVT1 (e.g., 3.0V) which is the upper limit of the threshold values with which it can be determined that a memory cell is in an erase state, is a boundary value. If the threshold value of the selected cell is higher than the boundary value, it is determined that the data of the selected cell is "0". If the threshold value of the selected cell is lower than the boundary value, it is determined that the data of the selected cell is "1".

If the data of the selected cell does not coincide with the expected value "1", erase NG is determined and a data erase step (an operation for taking out electrons in the floating gate) is executed to all the memory cells in the selected block.

Here, the data erase step is executed simultaneously to all of the memory cells in the selected block, which operation is peculiar to the flash EEPROM. Thus, the data erase step is executed even to the memory cells other than the selected cell for which data erase has been already completed.

This data erase step is repeatedly carried out until the Cycle or the number of erase steps reaches a preset number Limit and the data of the selected cell coincides with the expected value "1" (in steps ST66, ST68 and ST69).

When the Cycle or the number of program steps for the selected cell reaches the preset number Limit, the erase operation is ended even if the data of the selected cell does not coincide with the expected value "1" (in step ST66).

At this moment, a signal ERROR indicating that an erase step occurs is set at "1" (in step ST67).

On the other hand, if the data of the selected cell coincides with the expected value "1", erase OK is determined and the address Add is advanced by one, whereby the same operation is carried out to a memory cell (selected cell) at the next address.

At this moment, the numerical value of the timer 25 is not reset at the initial value. This is because the erase operation is carried out to all memory cells (in step ST71).

If the data of the selected cell coincides with the expected value "1" and the address Add corresponds to the final address in the block, then the erase operation is ended. At this moment, the threshold distribution of the memory cells in the selected block is that shown in, for example, FIG. 10 (in step ST70).

Next, it is checked whether or not the signal ERROR indicating the presence or absence of an erase error is "1". If an erase error occurs, that is, the signal ERROR is "1", then the erase operation is ended (in step ST5).

If data erase is surely executed, that is, the signal ERROR is "0", a convergence step is executed (in step ST6).

The convergence step is executed according to procedures shown in the sub-routine of FIG. 11.

First, the address Add (only columns are selected and all row address are unselected) of the address counter 16 is set at the initial value and the numerical value of the timer 25 (corresponding to the number of convergence steps) is set at the initial value "0" (in steps ST81 to ST82). In the potential generating circuit 22, internal power supply for leak check LCK. is set up (in step ST83).

Thereafter, a column leak check (leak check for memory cells in units of columns) is carried out (in step ST84).

The column leak check is to check a leak current flowing through a selected column and to determine whether or not a memory cell in an over-erase state exists while all rows (word lines) are unselected and one column is selected.

Namely, if the total leak current of all the memory cells in the selected column is lower than a reference value, it is determined that the data of the selected column is "0". If the total leak current of all the memory cells in the selected column is higher than the reference value, it is determined that the data of the selected column is "1".

Here, the reference value can be replaced by the threshold value of a memory cell. That is, this threshold value is assumed as an over-erase verify threshold value OEVT. The over-erase verify threshold value OEVT is set at, for example, about 0.5V. This setting is made because a leak current occurs to a memory cell having a threshold value lower than 0.5V.

The data of the selected column is compared with an expected value "0" (in step ST85).

If the data of the selected column does not coincide with the expected value "0", convergence NG is determined and a self convergence step (an operation for eliminating the over-erase state) is executed simultaneously to all of the memory cells in the selected column.

The convergence step can be also referred to as a weak program step. The weak program step means a program operation for setting a potential applied to the control gate (word line) of the selected memory cell low. In the weak program step, the potential of the selected word line is set at, for example, Vpw (e.g., a potential less than 10V).

This convergence step is repeatedly carried out until the Cycle reaches a preset number Limit and the data of the selected column coincides with the expected value "0" (in steps ST86, ST88 and ST89).

Further, when the Cycle or the number of program steps for the selected column reaches the preset number Limit, the convergence step is ended even if the data of the selected column does not coincide with the expected value "0" (in step ST86).

At this moment, a signal ERROR indicating that a convergence has not been completely executed is set at "1" (in step ST87).

On the other hand, if the data of the selected column coincides with the expected value "0", convergence OK is determined for all the memory cells in the selected column and the address Add is advanced by one, whereby the same operation is carried out to memory cells in the next column (in step ST91).

If the data of the selected column coincides with the expected value "0" and the address Add corresponds to an address for selecting the final column in the block, then the convergence step is ended.

When the convergence step is ended for all columns, the threshold voltage distribution of the memory cells in the selected block is that shown in, for example, FIG. 12 (in step ST90).

Next, it is checked whether or not the signal ERROR indicating that convergence has not been completely executed is "1". If the signal ERROR is "1", the erase operation is ended (in step ST7).

If the signal ERROR is "0", internal power supply for erase verify E. V. is set up in the potential generating circuit 22 (in step ST8).

Thereafter, the data of all memory cells in the selected block are read (in step ST9). The data of all the memory cells are compared with the expected value "1" (in step ST10).

That is, it is assumed that a potential (erase verify threshold value) EVT1 (e.g., 3.0V) which is the upper limit of the threshold values with which it can be determined that a memory cell is in an erase state, is a boundary value. If the threshold value of the selected cell is higher than a boundary value, it is determined that the data of the selected cell is "0". If the threshold value of the selected cell is lower than the boundary value, it is determined that the data of the selected cell is "1".

If the data of all the memory cells in the selected block coincide with the expected value "1", the erase operation is ended.

If the data of all the memory cells in the selected block do not coincide with the expected value "1", the erase operation is conducted again.

The reason for conducting erase verify after the convergence step is that the upper limit of the threshold voltage distribution of the memory cells may exceed the erase verify threshold value EVT1 again as a result of the convergence step.

Meanwhile, in the NOR-type flash EEPROM, a write (program)/erase test for conducting data program steps and data erase steps repeatedly is executed as a product reliability test.

The sequence of this write/erase test is shown in FIG. 13. Namely, the sequence is the same as the above-stated automatic erase sequence except that the data program steps and data erase steps are repeatedly carried out until the number N of write/erase cycles reaches a maximum number Nmax. That is, the sub-routine of the program step is that shown in FIG. 7, the sub-routine of the erase step is that shown in FIG. 9 and the sub-routine of the convergence step is that shown in FIG. 11.

As stated above, in the conventional NOR-type flash EEPROM, to prevent the occurrence of memory cells in the over-erase state, for example, the erase sequence of the erase operation or that of the write/erase test includes a convergence step.

This convergence step, however, increases time for block erase (or chip erase) conducted to the memory cells.

After data erase, in particular, if the threshold voltage distribution of the memory cells becomes too wide and many memory cells in the over-erase state occur, then it is required to carry out a column leak check and a convergence step (weak program) to almost all bit lines (columns) sequentially and block erase (or chip erase) time thereby becomes very long.

For example, if the erase step for taking out electrons from the floating gate to the channel requires about 100 [ms], the convergence step requires about 1 [s] and the pre-program step executed for all bits requires about 700 [ms], then the erase operation (the pre-program step, the erase step and the convergence step) requires at least about 1.8 [s].

Further, as stated above, a write/erase test for carrying out the program operation and the erase operation repeatedly is conducted as a reliability test in, for example, the flash EEPROM. In this case, the erase operation naturally includes a convergence step.

Consequently, if the program operation and the erase operation are repeatedly carried out, for example, about 1000 times, it takes 1.8 [s]×1000=1800 [s], i.e., 30 minutes per block.

Meanwhile, since test time is proportional to test cost, the longer test time means higher test cost.

If the convergence step is eliminated from the erase operation during the write/erase test, time for one write/erase cycle becomes 0.8 [s] in the above case. Thus, if the program operation and the erase operation are repeatedly carried out about 1000 times, it takes 0.8 [s]×1000=800 [s] per block, making it possible to halve test time compared with that for the operation including the convergence step.

The flash EEPROM having the erase sequence in which the convergence step is executed, requires test time twofold of that for the flash EEPROM having the erase sequence without the convergence step and test cost for the former EEPROM is pushed up accordingly.

These situations become quite serious for, for example, a low-voltage NOR-type flash EEPROM. Namely, if voltage is lowered and a power supply potential Vcc is decreased from, for example, 5V to about 3V, then a potential (read potential) Vcc applied to a selected word line is decreased as well.

The decrease of the read potential Vcc means that the threshold voltage distribution of memory cells after block erase has to fall within a narrow range between Vss (0V) and Vcc.

In this case, as shown in, for example, FIG. 14, an erase verify threshold value EVT1 as a reference for erase verify is lowered. Due to this, if the width of the threshold distribution of the memory cells after block erase remains the same, the lower limit EVTL of the threshold voltage distribution is lowered as well. As a result, the lower limit EVTL becomes far lower than the above-stated over-erase verify threshold value OEVT. In the convergence step, the number of memory cells, to which the weak program for setting the lower limit EVTL higher than the over-erase verify threshold value OEVT is conducted, increases, resulting in longer test time.

BRIEF SUMMARY OF THE INVENTION

The present invention has been made to solve the above-stated disadvantages. It is, therefore, an object of the present invention to provide a novel erase sequence in which no memory cell in an over-erase state occurs during erase operation in a flash EEPROM which may have a disadvantage if a memory cell in an over-erase state occurs, thereby to eliminate a convergence step (weak program) from the erase operation, to shorten erase operation time, to shorten test time and to, therefore, reduce test cost.

A nonvolatile semiconductor memory according to the present invention comprises a control circuit outputting a first control signal during an erase verify operation; a potential generating circuit generating one of the first erase verify threshold value and the second erase verify threshold value higher than the first erase verify threshold value based on the first control signal; and a verify circuit determining a data value read from a memory cell by means of one of the first and second erase verify threshold values, comparing the data value with an expected value and determining whether data erase is completed. If the potential generating circuit generates the second erase verify threshold value, the lower limit of the threshold voltage distribution is higher than an over-erase verify threshold value serving as a reference to determine whether an over-erase cell exists.

An erase verify method of a nonvolatile semiconductor memory according to the present invention comprises the steps of, while assuming a first erase verify threshold value as EVT1, a lower limit of the first threshold voltage distribution obtained after completion of data erase as EVTL when erase verify read is conducted using the erase verify threshold value, the second erase verify threshold value higher than the first erase verify threshold value as EVT2 and an over-erase verify threshold value serving as a reference to determine whether an over-erase cell exists as OEVT, setting a relationship of EVT2−EVT1≧OEVT−EVTL; and after conducting an erase step to a memory cell to which the data erase is conducted, conducting the erase verify read using the second erase verify threshold value and determining a data value read from the memory cell. If the erase verify read is conducted using the second erase verify threshold value, the lower limit of the second threshold voltage distribution obtained after completion of the data erase is higher than the over-erase verify threshold value.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

[A]

A nonvolatile semiconductor memory according to the present invention will be described in detail hereinafter with reference to the accompanying drawings.

Figure 1:
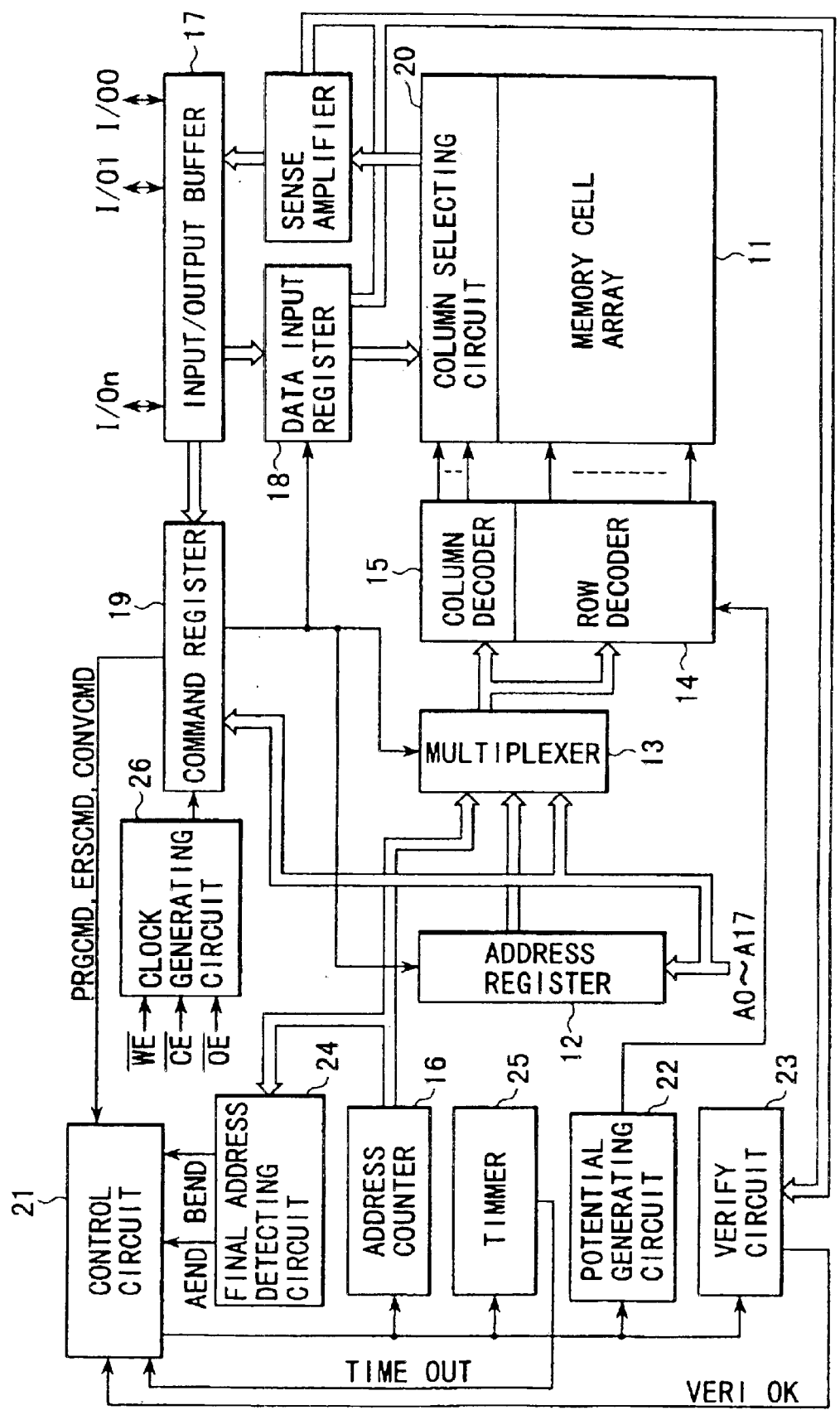
FIG. 1 shows a conventional NOR-type flash EEPROM.
Figure 2:
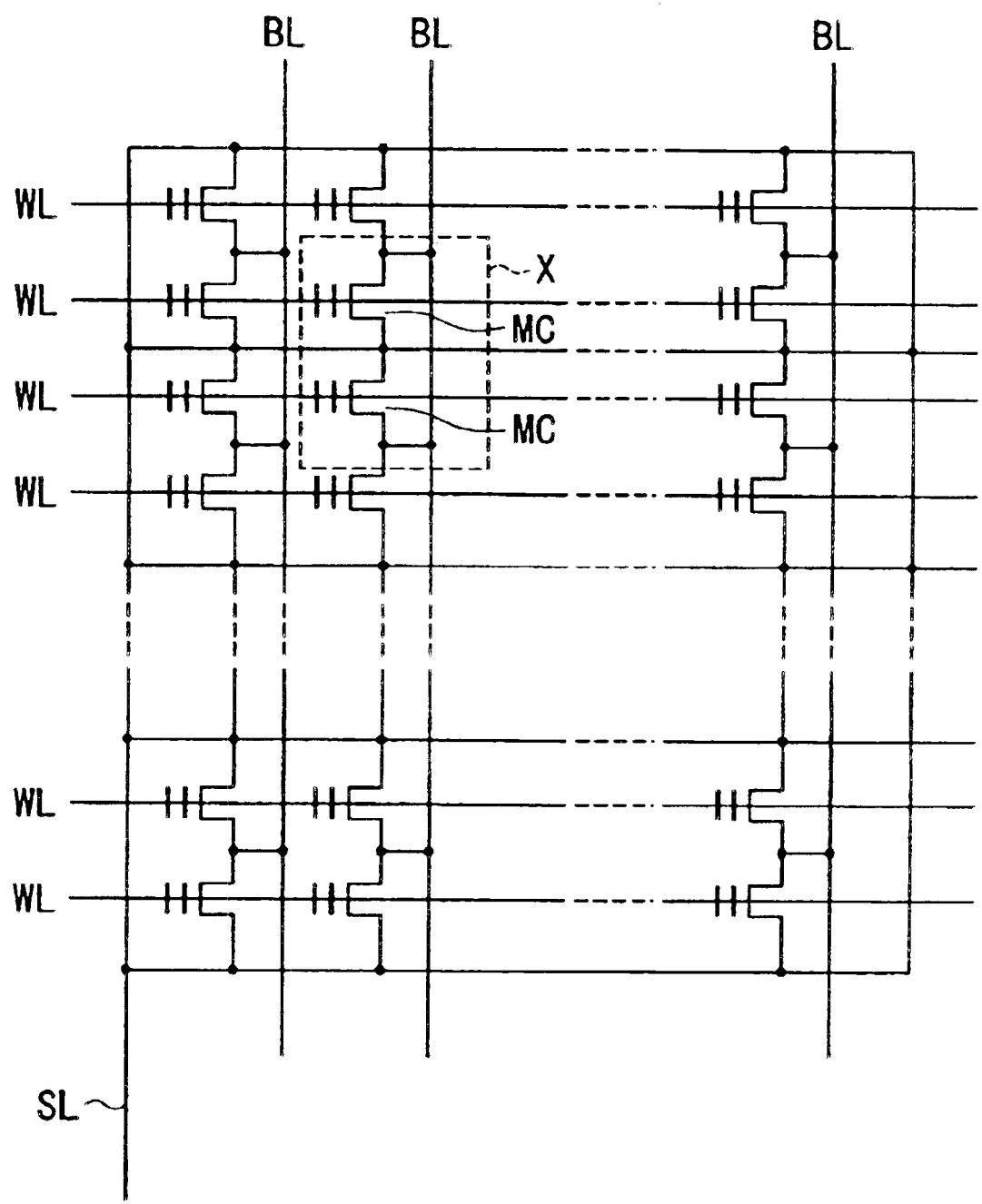
FIG. 2 shows a memory cell array shown in FIG. 1.
Figure 3:
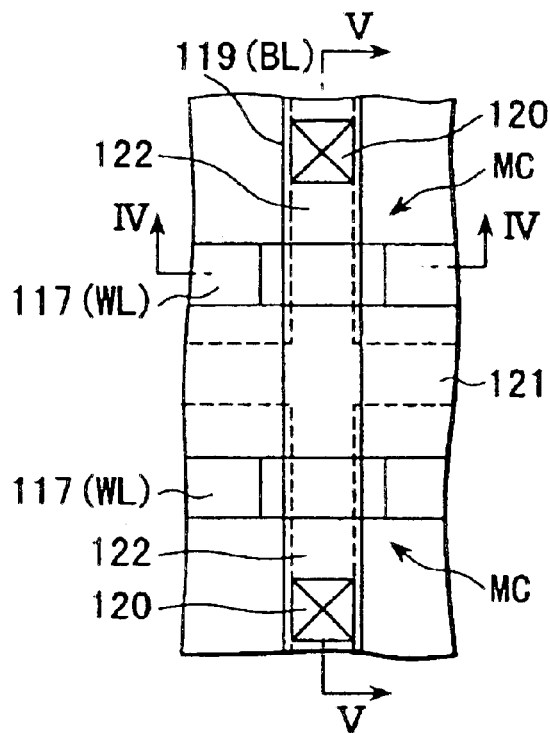
FIG. 3 shows the device structure of a region enclosed by broken line X of FIG. 2.
Figure 4:
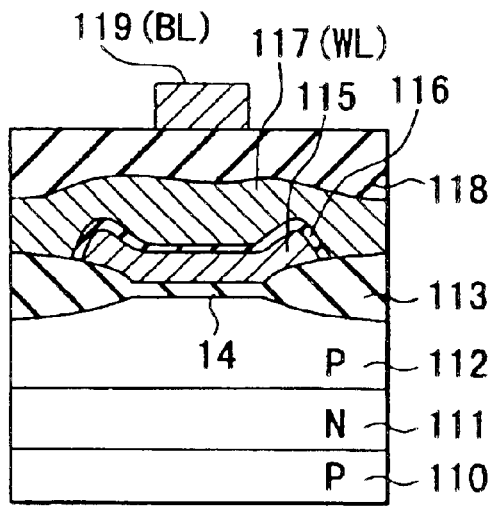
FIG. 4 is a cross-sectional view taken along the line IV—IV of FIG. 3.
Figure 5:
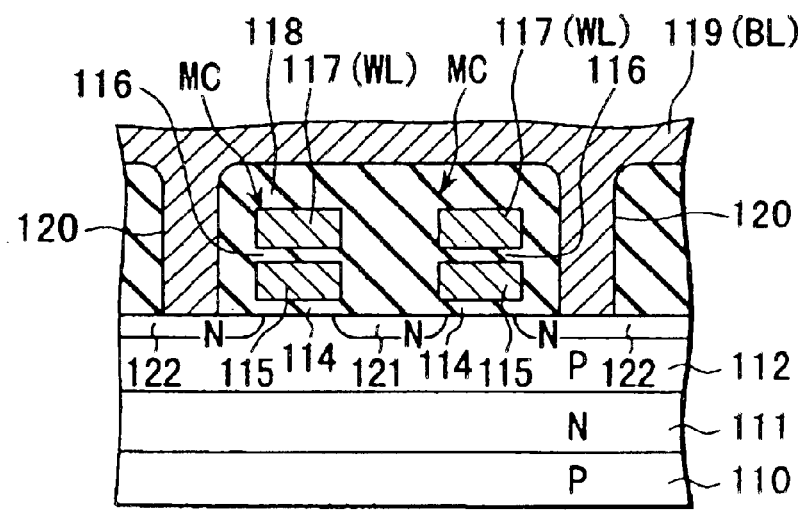
FIG. 5 is a cross-sectional view taken along the line V—V of FIG. 3.
Figure 6:
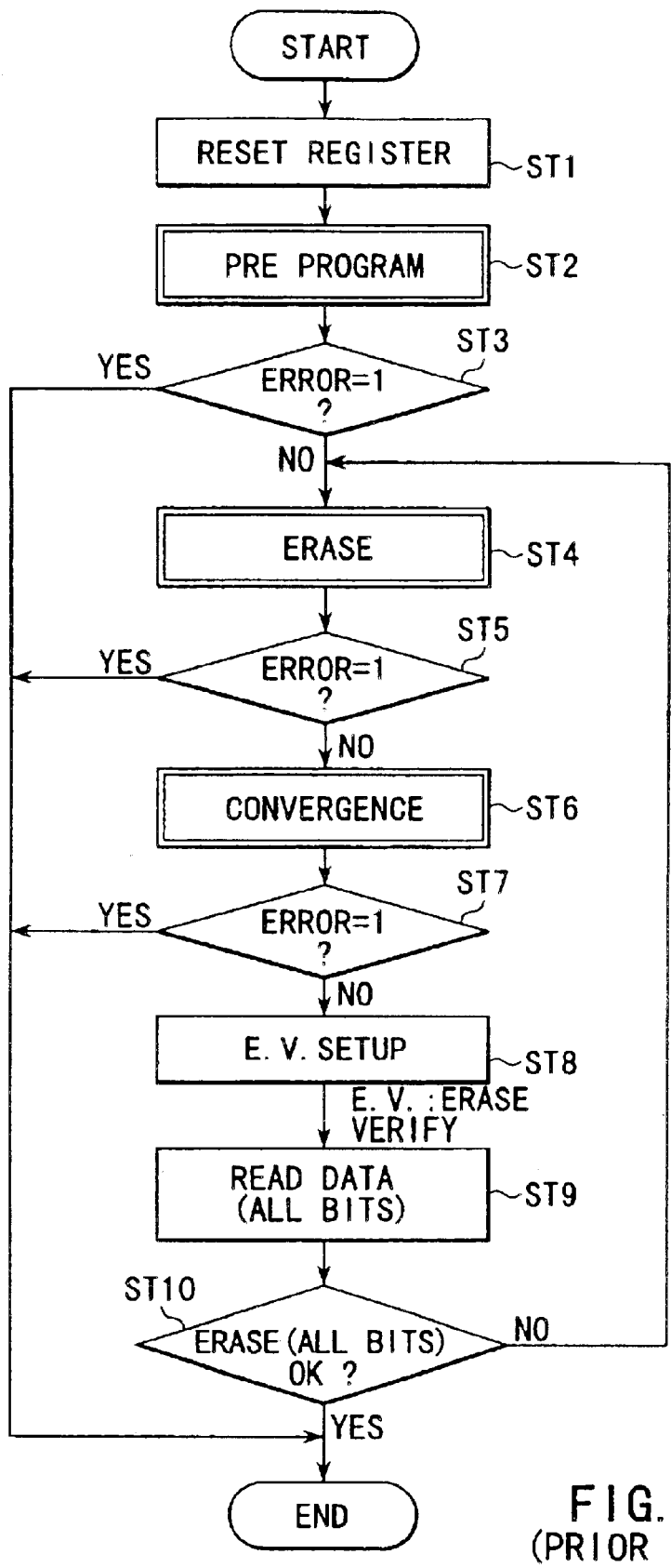
FIG. 6 shows a conventional automatic erase sequence.
Figure 7:
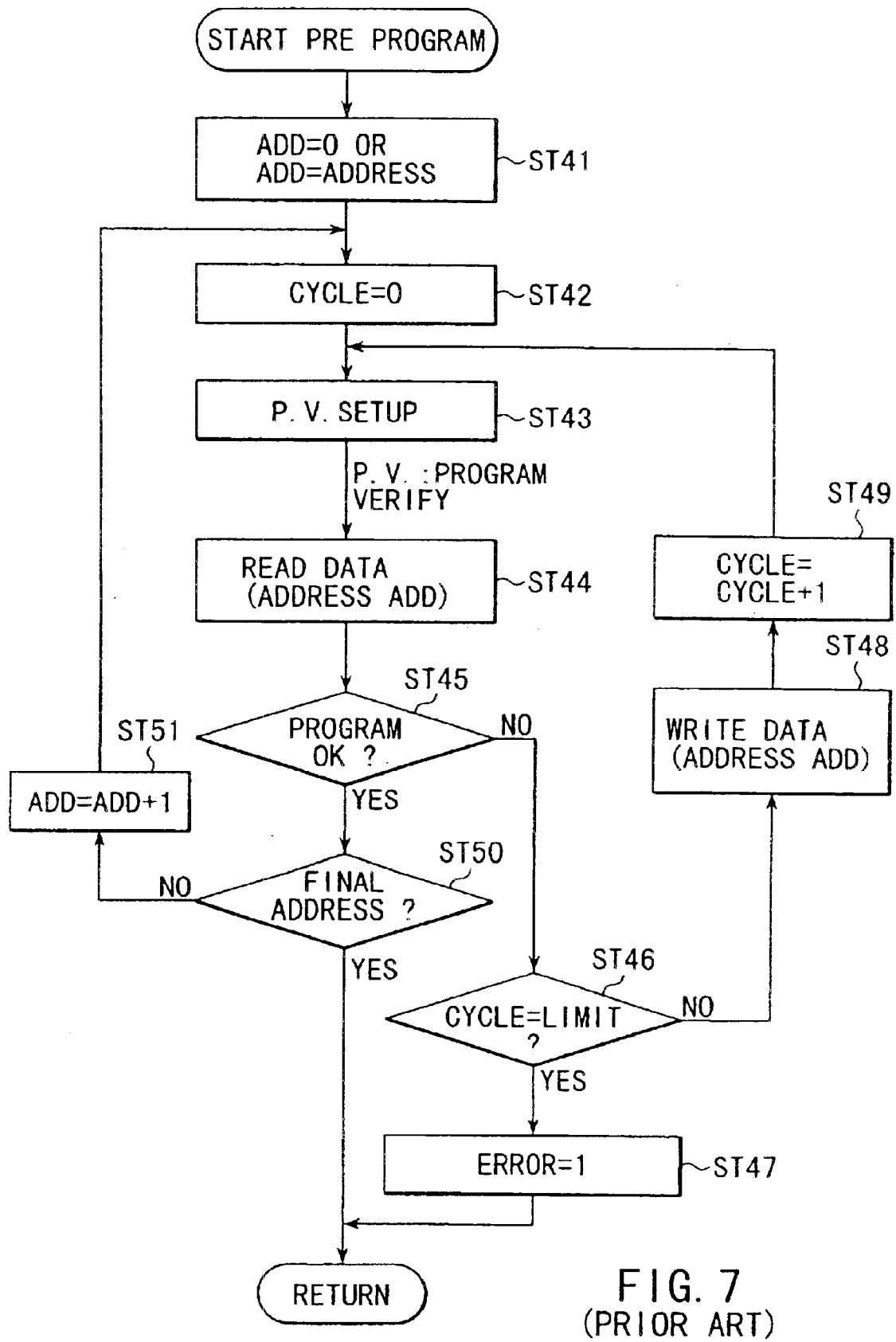
FIG. 7 shows the sub-routine of a PROGRAM STEP.
Figure 8:
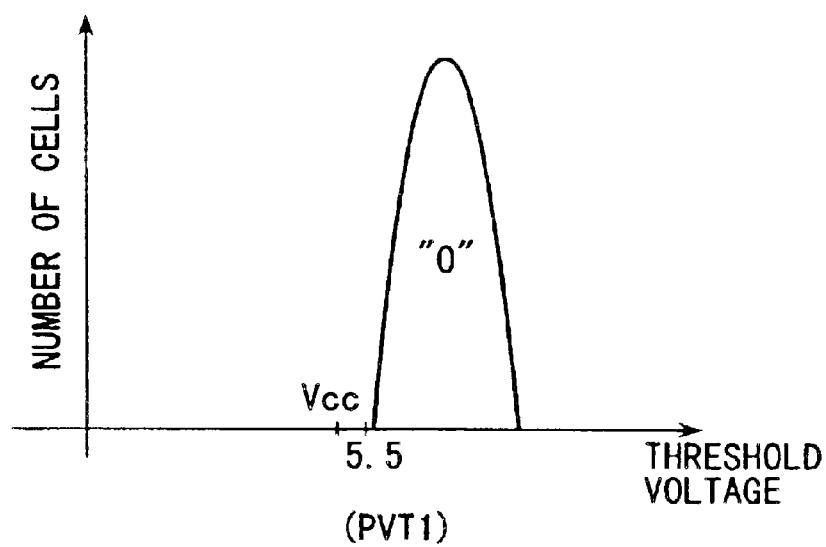
FIG. 8 shows a threshold voltage distribution of cells after the PROGRAM STEP.
Figure 10:
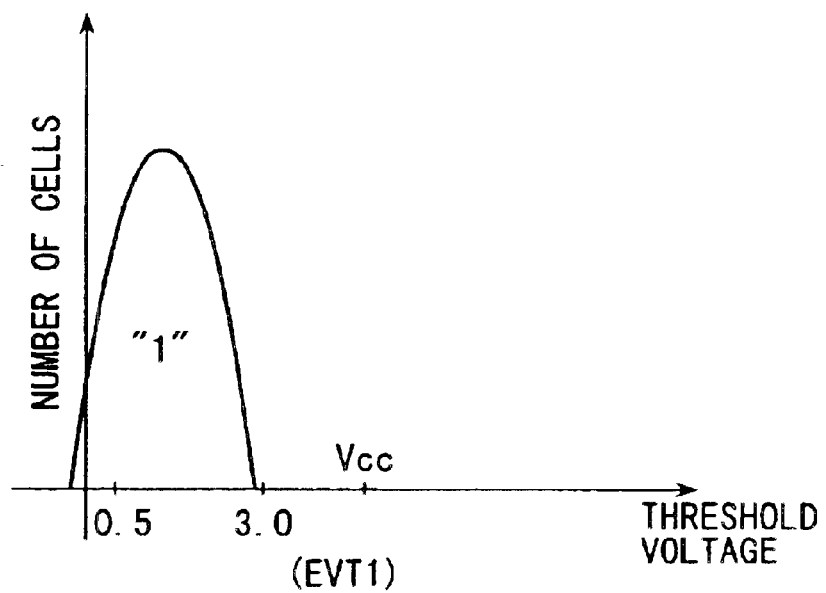
FIG. 10 shows the threshold voltage distribution of the cells after the ERASE STEP.
Figure 9:
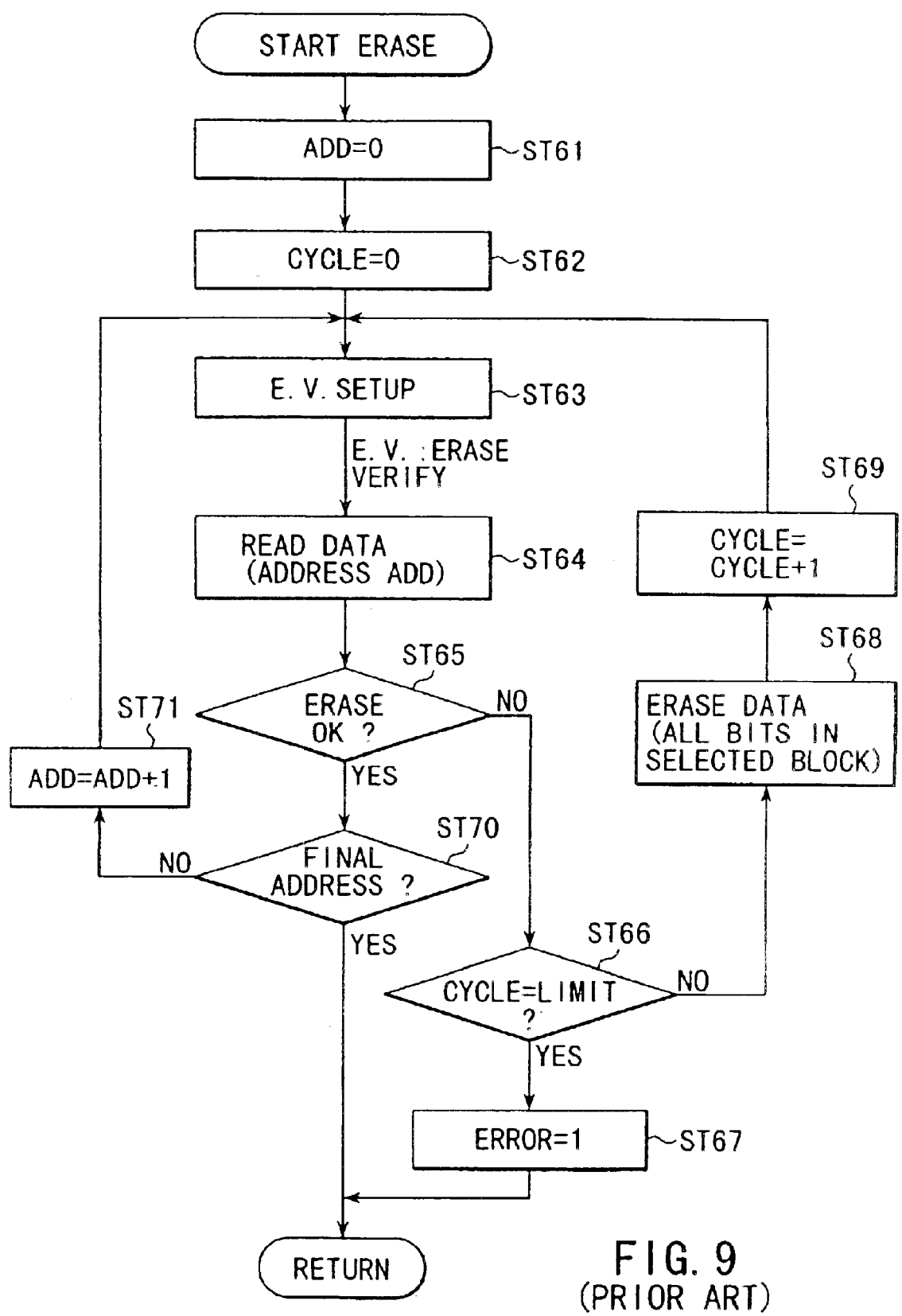
FIG. 9 shows the sub-routine of an ERASE STEP.
Figure 11:
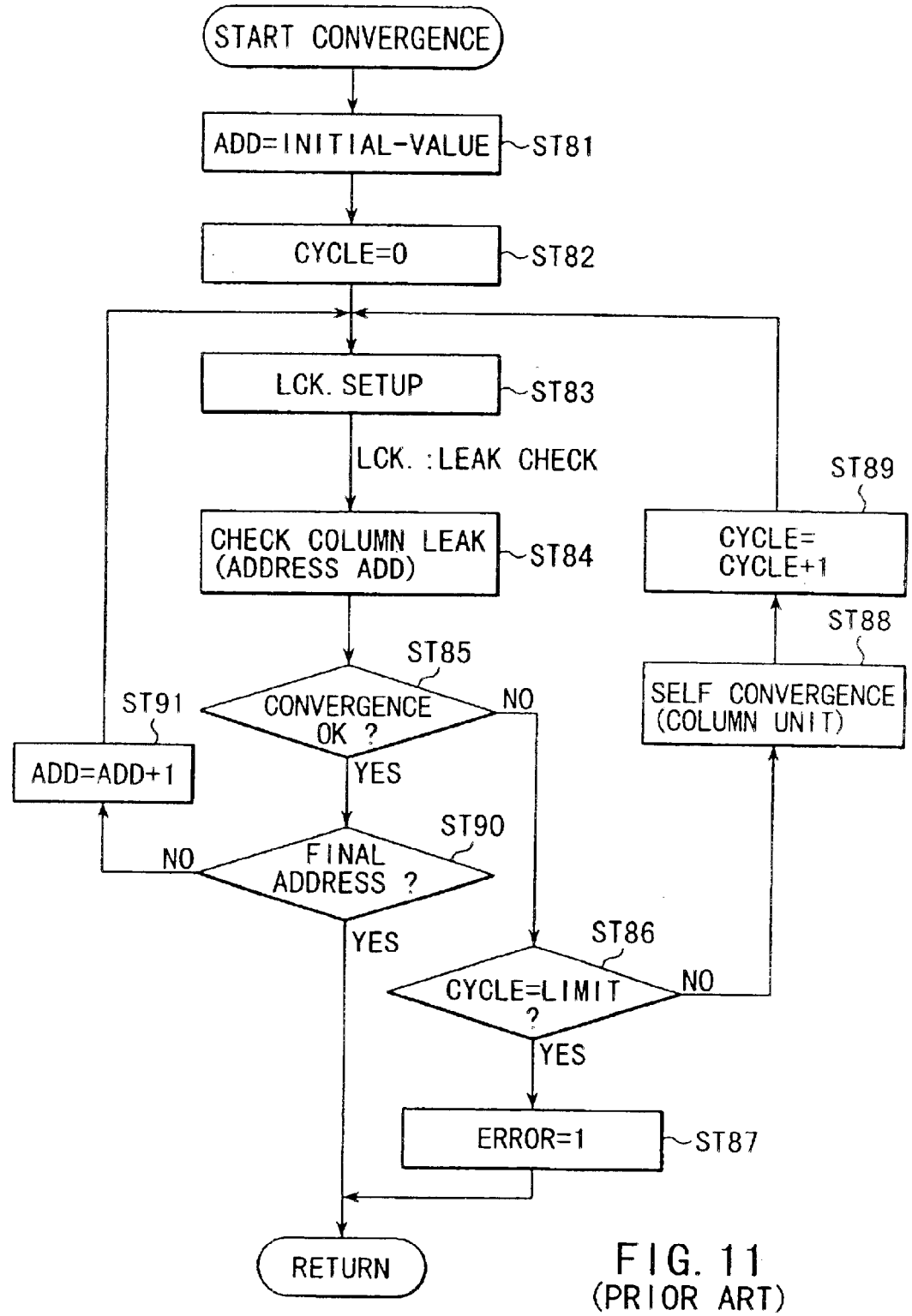
FIG. 11 shows the sub-routine of a CONVERGENCE STEP.
Figure 12:
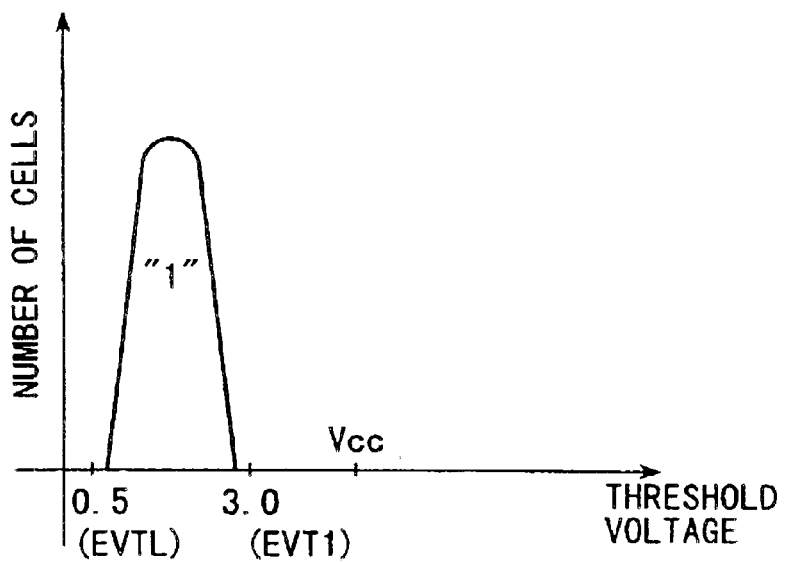
FIG. 12 shows the threshold voltage distribution of the cells after the CONVERGENCE STEP.
Figure 14:
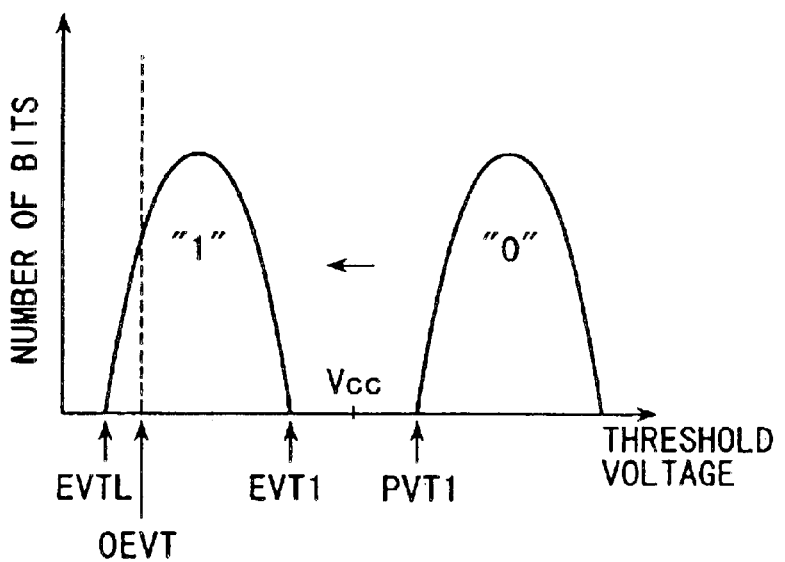
FIG. 14 is an explanatory view for memory cells in an over-erase state.
Figure 13:
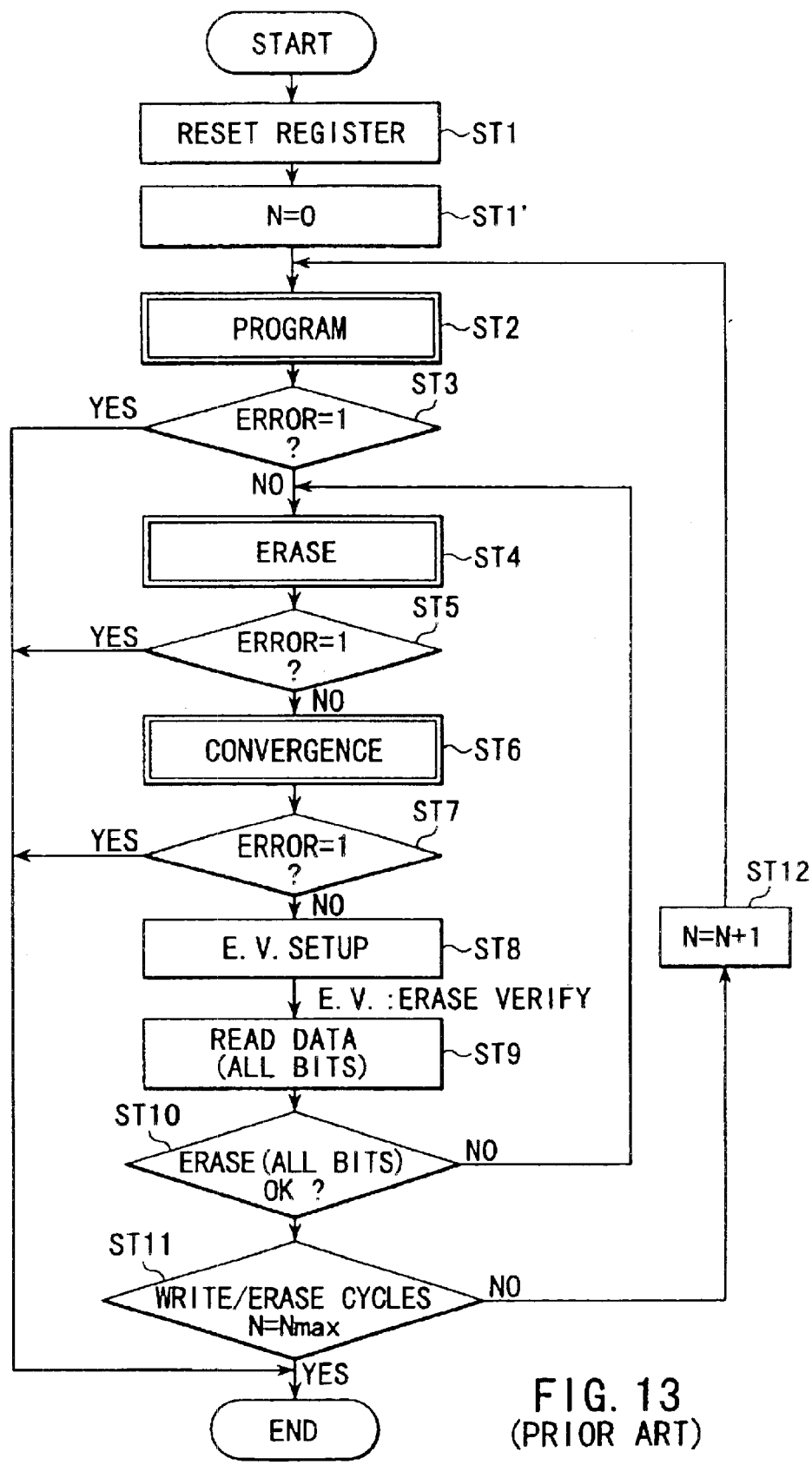
FIG. 13 shows the sequence of a conventional program test.
Figure 15:
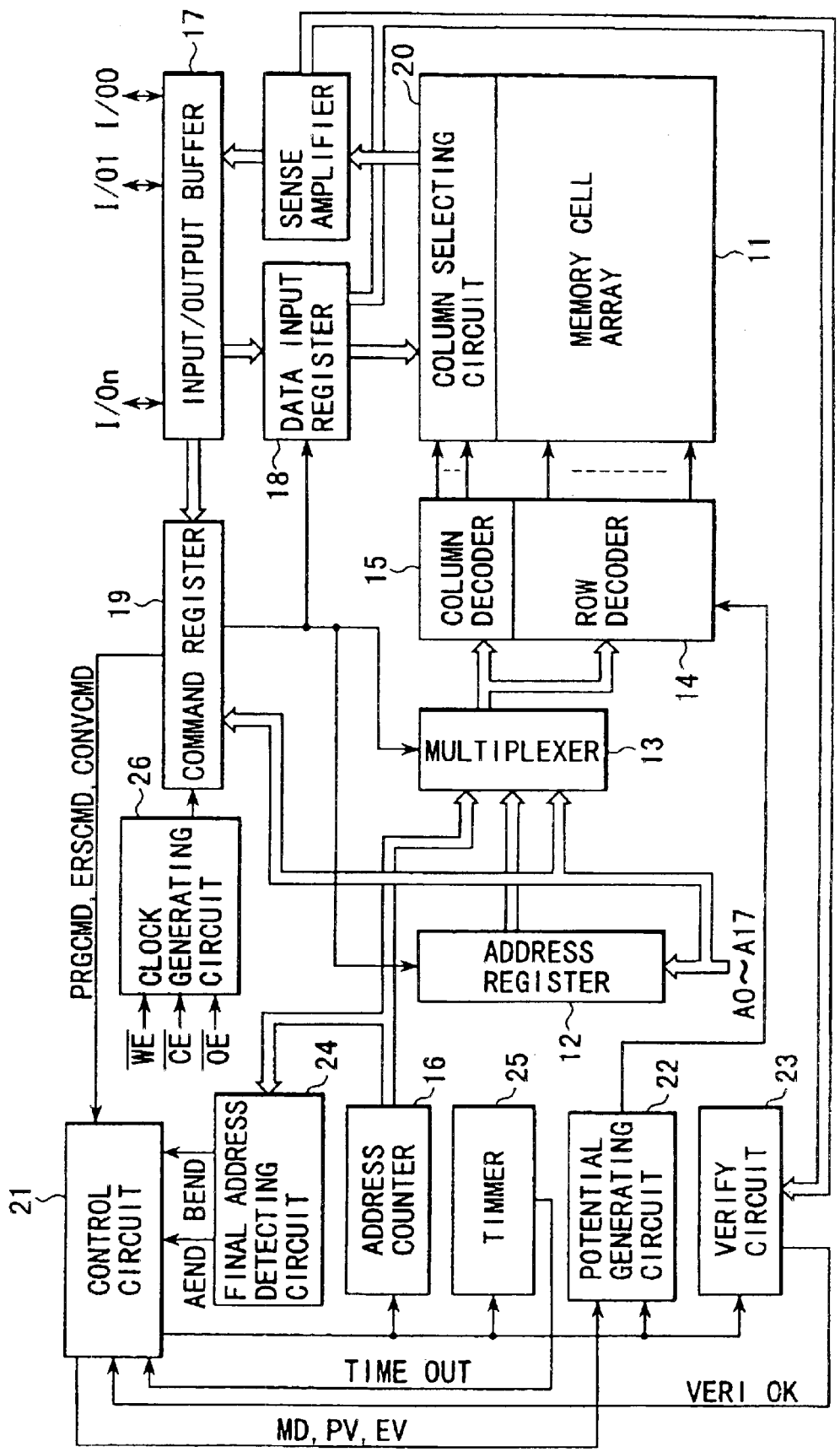
FIG. 15 shows a NOR-type flash EEPROM according to the present invention.

FIG. 15 shows the important parts of a NOR-type flash EEPROM according to the present invention.

A memory cell array 11 consists of a plurality of blocks and each block consists of NOR-type memory cells.

External addresses A0, A1 to A17 are input to a multiplexer 13 either directly or through an address register 12. An address counter 16 generates internal addresses. The multiplexer 13 feeds either an external address or an internal address to a row decoder 14 and a column decoder 15.

Input data is fed to a data input register 18 and a command register 19 through an input/output buffer 17. The data of the data input register 18 is supplied to memory cells through a column selecting circuit 20.

The command register 19 recognizes a command consisting of an address and a data and outputs a control signal to the address register 12, the multiplexer 13, the data input register 18 and a control circuit 21 in response to the command.

The control circuit 21 recognizes an operation mode to be executed next based on the control signal output from the command register 19.

A potential generating circuit 22 generates various potentials corresponding to operation modes. The potential generated by the potential generating circuit 22 is applied to the control gates and the bit lines of the memory cells in each operation mode.

The present invention is characterized by an erase verify threshold value for erase verify operation, i.e., a read potential applied to a selected word line during erase verify read operation. Namely, the control circuit 21 applies a new control signal MD peculiar to the present invention to the potential generating circuit 21 during the erase verify operation. The potential generating circuit 22 can change the erase verify threshold value for the erase verify operation, i.e., the read potential during the erase verify operation based on the control signal MD.

Likewise, the present invention is characterized by a program verify threshold value for program verify operation, i.e., a read potential applied to a selected word line during program verify operation. Namely, the control circuit 21 applies a new control signal MD peculiar to the present invention to the potential generating circuit 22 during the program verify operation. The potential generating circuit 22 can change the program verify threshold value for the program verify operation, i.e., the read potential during the program verify operation.

The verify circuit 23 determines whether or not data program operation or data erase operation is surely conducted to the selected memory cell and outputs a result VERIOK to the control circuit 21.

A final address detecting circuit 24 outputs a detection signal AEND indicating whether or not the final address of each block of the memory cell array 11 is detected and outputs a detection signal BEND indicating whether or not the final block of the memory cell array 11 is detected.

A timer 25 counts the number of program steps or the number of erase steps conducted to the selected memory cell. The timer 25 outputs a time out signal TIME OUT to the control circuit 21 when the number of program steps or that of erase steps for the selected memory cell reaches a predetermined number.

A clock generating signal 26 generates a clock for controlling the internal operation of the flash EEPROM based on a write enable signal $\overline{WE}$, a chip enable signal $\overline{CE}$, an output enable signal $\overline{OE}$ and the like.

Figure 16:
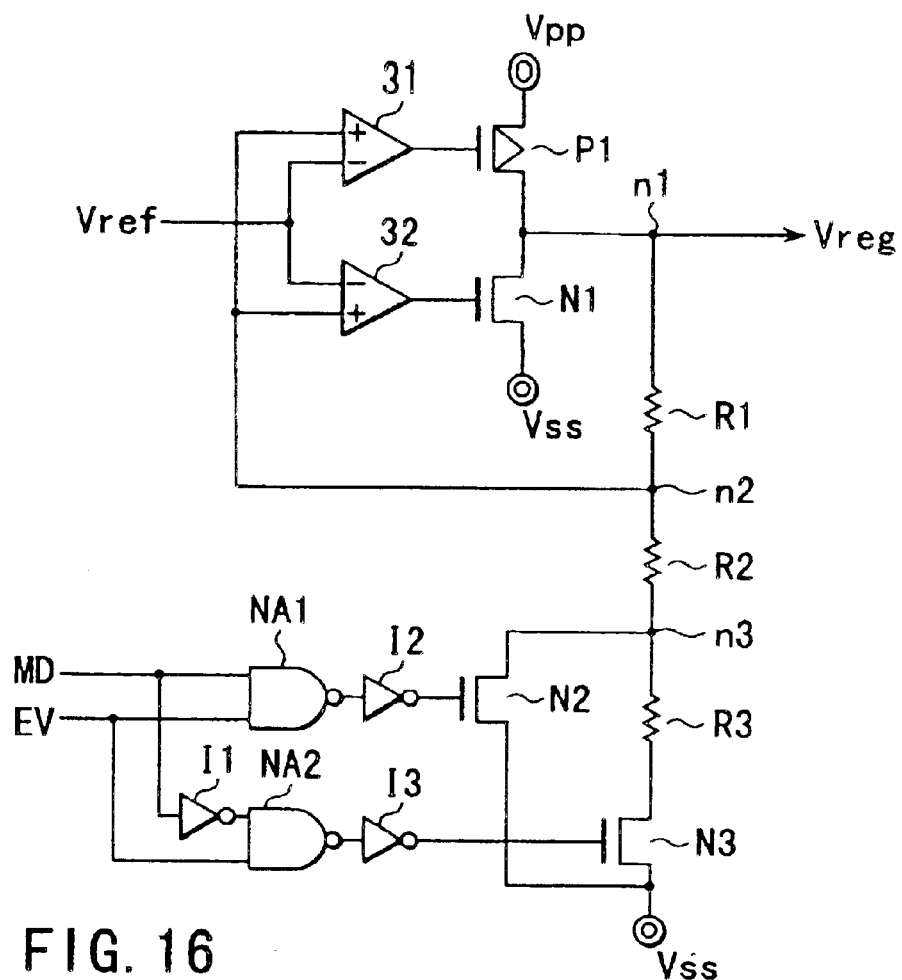
FIG. 16 shows a circuit generating an erase verify threshold value.

FIG. 16 shows an example of a circuit arranged in the potential generating circuit 22 of FIG. 15 and generating a potential applied to a selected word line during erase verify read operation.

A reference potential Vref is input to the negative side input terminals of operational amplifiers 31 and 32. The output terminal of the operational amplifier 31 is connected to the gate of a P-channel type MOS transistor P1 and the output terminal of the operational amplifier 32 is connected to the gate of an N-channel type MOS transistor N1.

The two MOS transistors P1 and P2 are connected in series between a high potential side power supply terminal Vpp and a low potential side power supply terminal Vss. The connection node (drain) n1 between the two MOS transistors P1 and P2 serves as the output terminal of this circuit.

Three resistors R1, R2 and R3 and an N-channel type MOS transistor N3 are connected in series between the connection node n1 and the low potential side power supply terminal Vss. The connection node n2 between the resistors R1 and R2 is connected to the positive side input terminals of the operational amplifiers 31 and 32.

That is to say, in this circuit, the potential Vreg of the output node n1 is set so that the reference potential Vref is equal to the potential of the connection node n2.

The connection point between the resistors R2 and R3 is a connection node n3. An N-channel type MOS transistor N2 is connected between the connection node N3 and the low potential side power supply terminal Vss.

Control signals MD and EV are input to an NAND circuit NA1. The output terminal of the NAND circuit NA1 is connected to the gate of the MOS transistor N2 through an inverter 12. The inverted signal of the control signal MD and the control signal EV are input to an NAND circuit NA2. The output terminal of the NAND circuit NA2 is connected to the gate of the MOS transistor N3 through an inverter 13.

The control signal EV turns into "1" during the erase verify operation. When the control signal MD is "0" during the erase verify operation, the MOS transistor N2 is turned off and the MOS transistor N3 is turned on. Thus, the output signal Vreg turns into Vev1. When the control signal MD is "1" during the erase verify operation, the MOS transistor N2 is turned on and the MOS transistor N3 is turned off. Thus, the output signal Vreg turns into Vev2.

Figure 17:
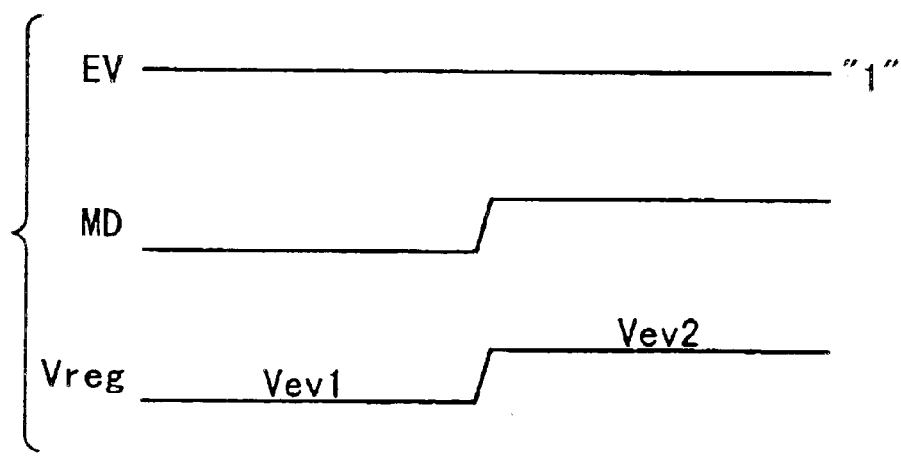
FIG. 17 is a waveform view showing the operation of the circuit of FIG. 16.

As shown in FIG. 17, Vev1 and Vev2 satisfy the relationship of Vev1<Vev2. That is, if the resistor R3 is present between the node n3 and the low potential side power supply terminal Vss, the output signal Vreg turns into Vev1. If the resistor R3 is not present between the node n3 and the low potential side power supply terminal Vss, the output signal Vreg turns into Vev2 higher than Vev1.

Figure 18:
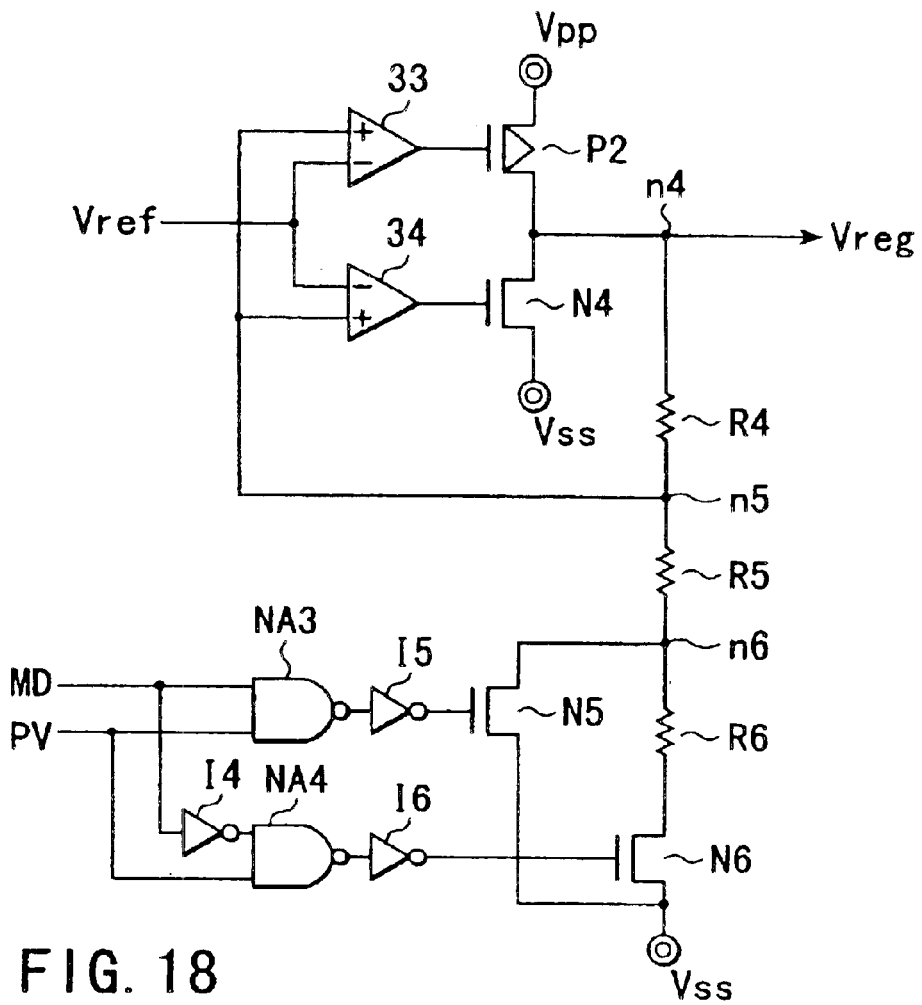
FIG. 18 shows a circuit generating a program verify threshold value.

FIG. 18 shows an example of a circuit arranged in the potential generating circuit shown in FIG. 15 and generating a potential applied to the selected word line during program verify read operation.

A reference potential Vref is input to the negative side input terminals of operational amplifiers 33 and 34. The output terminal of the operational amplifier 33 is connected to the gate of a P-channel type MOS transistor P2 and the output terminal of the operational amplifier 34 is connected to the gate of an N-channel type MOS transistor N4.

The two MOS transistors P2 and N4 are connected in series between a high potential side power supply terminal Vpp and a low potential side power supply terminal Vss. The connection node (drain) n4 between the two MOS transistors P2 and N4 serves as the output terminal of this circuit.

Three resistors R4, R5 and R6 and an N-channel type MOS transistor N6 are connected in series between the connection node n4 and the low potential side power supply terminal Vss. The connection node n5 between the resistors R4 and R5 is connected to the positive side input terminals of the operational amplifiers 33 and 34.

That is, in this circuit, the potential Vreg of the output node n4 is set so that the reference potential Vref is equal to the potential of the connection node n5.

The connection point between the resistors R5 and R6 is a connection node n6. An N-channel type MOS transistor N5 is connected between the connection node n6 and the low potential side power supply terminal Vss.

Control signals MD and PV are input to an NAND circuit NA3. The output terminal of the NAND circuit NA3 is connected to the gate of an MOS transistor N5 through an inverter I5. The inverted signal of the control signal MD and the control signal PV are input to an NAND circuit NA4. The output terminal of the NAND circuit NA4 is connected to the gate of an MOS transistor N6 through an inverter 16.

The control signal PV turns into "1" during program verify operation. When the control signal MD is "0" during the program verify operation, the MOS transistor N5 is turned off and the MOS transistor N6 is turned on. Thus, the output signal Vreg turns into Vpv1. When the control signal MD is "1" during the program verify operation, the MOS transistor N5 is turned on and the MOS transistor N6 is turned off. Thus, the output signal Vreg turns into Vp2.

Figure 19:
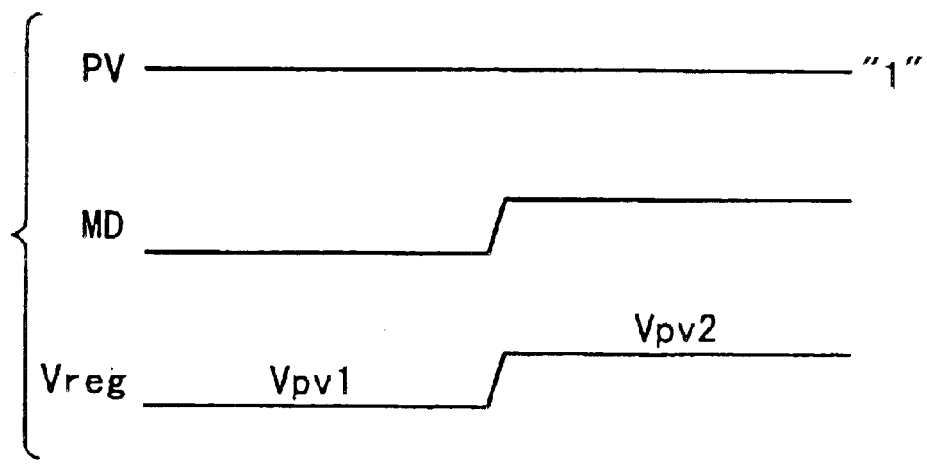
FIG. 19 is a waveform view showing the operation of the circuit of FIG. 18.

As shown in FIG. 19, Vpv1 and Vpv2 satisfy the relationship of Vpv1<Vpv2. That is, if the resistor R6 is present between the node n6 and the low potential side power supply terminal Vss, the output signal Vreg turns into Vp1. If resistor R6 is not present between the node n6 and the low potential side power supply terminal Vss, the output signal Vreg turns into Vpv2 higher than Vpv1.

Needless to say, a circuit generating a program potential Vpp for program operation and an erase potential Vee for erase operation besides the circuits shown in FIGS. 16 and 18 is arranged in the potential generating circuit 22 shown in FIG. 15. If a program method for gradually changing the program potential Vpp during the program operation, in particular, a program potential generating circuit having the same configuration as that of the circuit shown in FIG. 16 or 18 is arranged in the potential generating circuit 22.

Next, the concept of erase operation according to the present invention by employing the NOR-type flash EEPROM shown in FIGS. 15 to 19 will be described.

First, as preconditions, it is assumed that a normal program verify threshold value is PVT1, a normal erase verify threshold is EVT1 and an over-erase verify threshold value is OEVT.

Figure 20:
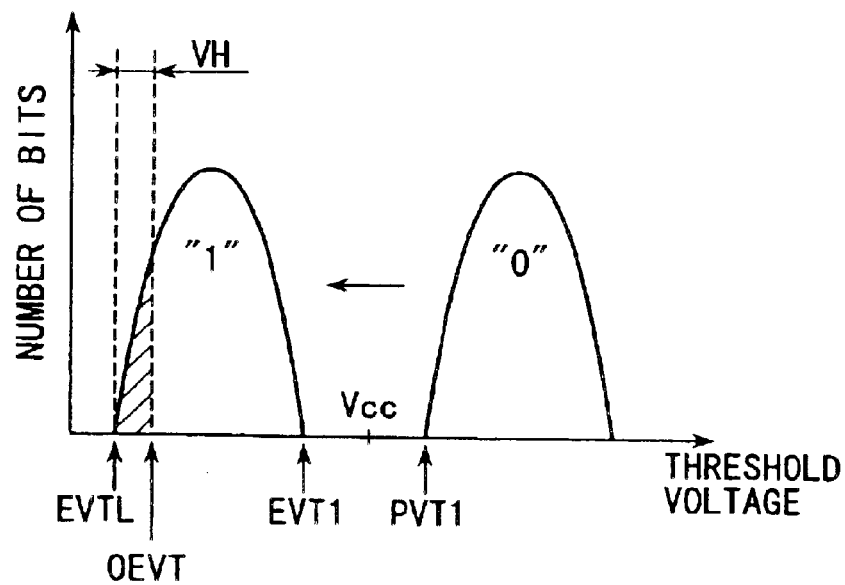
FIG. 20 is an explanatory view for the principle of the present invention.

If a block erase (chip erase) operation or a write/erase test is conducted under these conditions, first, all memory cells in each block are turned into a "0"-programming state as shown in FIG. 20. At this moment, the program verify threshold value is set at PVT1 according to the above-stated preconditions, so that the threshold voltage distribution of the memory cells in the "0" state in the block is that shown in FIG. 20.

Next, data erase operation is conducted to all the memory cells in the block. Since the erase verify threshold value during this erase operation is set at EVT1, the threshold voltage distribution of the memory cells in the "1" state (erase state) in the block after the erase operation is that shown in FIG. 20. Namely, the threshold voltage distribution of the memory cells in the erase state in the block has an upper limit EVT1 and a lower limit EVTL.

On the other hand, since the over-erase verify threshold value is set at OEVT, it is judged that the memory cells having threshold values lower than the over-erase verify threshold value OEVT are in an over-erase state (as shown in a hatched portion in FIG. 20).

Figure 21:
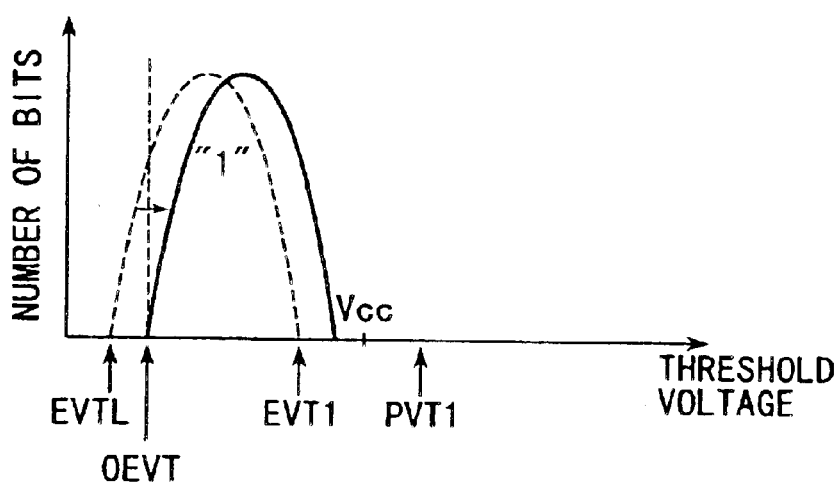
FIG. 21 is an explanatory view for the principle of the present invention.

Due to this, as show in FIG. 21, a weak program is conventionally conducted to the memory cells having threshold values lower than the over-erase verify threshold value OEVT in a convergence step. As a result, the lower limit EVTL of the threshold voltage distribution of the memory cells in the erase state in the block becomes not less than the over-erase verify threshold value OEVT.

In other words, due to the convergence step (weak program), time required for the block erase (or chip eras) operation and write/erase test conventionally increases.

Considering this, according to the present invention, the difference VH (=OEVT−EVTL) between the lower limit EVTL of the threshold voltage distribution of the memory cells in the block and the over-erase verify threshold value OEVT after the erase operation is determined in advance as shown in FIG. 20.

When data erase is conducted to the memory cells in the block, the erase verify threshold value EVT2 is set at a potential higher than EVT1 by VH or more as shown in FIG.

Figure 22:
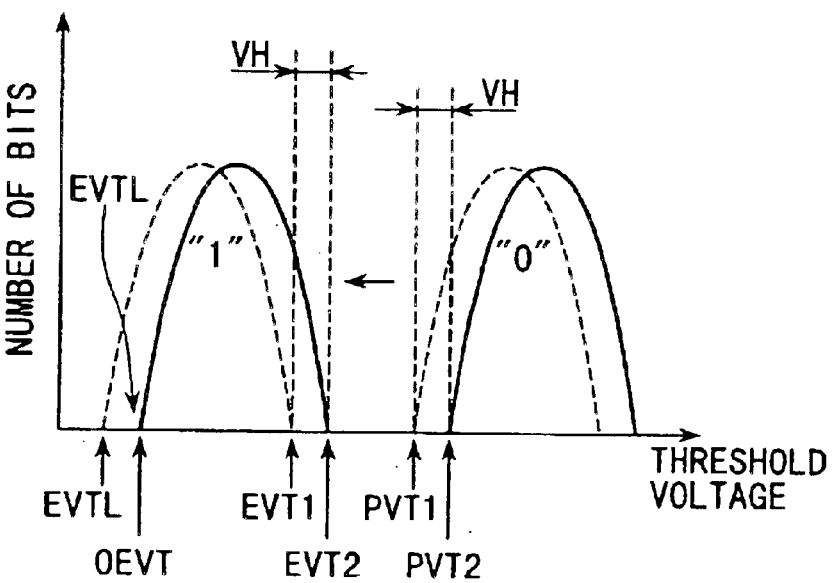
FIG. 22 is an explanatory view for the principle of the present invention.

22. That is, although the shape of the threshold voltage distribution (threshold voltage distribution width) does not change per se, the erase verify threshold value for the erase verify operation conducted after data erase is set at EVT2, whereby the lower limit EVTL of the threshold voltage distribution of the memory cells in the block after the erase operation never fails to be not less than the over-erase verify threshold value OEVT (as indicated by a solid line shown in FIG. 22).

As can be seen from the above, according to the present invention, the erase verify threshold value is set at EVT2 which satisfies the following relationship and the memory cells in the over-erase state do not occur, with the result that the present invention can advantageously dispense with the convergence step:

$$EVT2 \geq EVT1+(OEVT-EVTL)$$

Further, the present invention can also switch these two types of erase verify threshold values EVT1 and EVT2 according to an operation mode.

As described above, the disadvantage of including the convergence step in the erase operation becomes particularly serious during the write/erase test.

This is because the program step and the erase step are conducted repeatedly a number of times (e.g., about 1000 times) in the write/erase test.

Owing to this, EVT1 can be used as the erase verify threshold value in the erase mode during normal operation and EVT2 can be used as the erase verify threshold value in the erase mode during the write/erase test. This makes it possible to eliminate the convergence step from the erase operation during the write/erase test and to thereby reduce test cost resulting from the shortened test time.

In the erase mode during normal operation, EVT1 is used as the erase verify threshold value and the convergence step is executed, thereby making it possible to easily converge the threshold voltage distribution of the memory cells after data erase between Vss and Vcc and to deal with the lowered voltage of the power supply potential Vcc.

In the meantime, when the erase verify threshold value is set at ETV2, the program verify threshold value can be also changed from PVT1 to a potential PVT2 shown in the following formula so as to make the quantity of charge passed through tunnel oxide films during the write/erase test according to the present invention equal to the quantity of charge passed through the tunnel oxide films during the normal operation (conventional write/eras test):

$$PVT2 \geq PVT1+(OEVT-EVTL)=PVT1+(EVT2-EVT1).$$

That is, in order to improve the reliability of the write/erase test (tunnel oxide film durability test), it is necessary to make the quantity of charge passed through the tunnel oxide films during the write/erase test equal to the quantity of charge passed through the tunnel oxide films during the normal operation. On the other hand, the quantity of charge passed through the tunnel oxide films is substantially equal to the difference between the threshold value of the memory cells in the erase state ("1" state) and that of the memory cells in the program state ("0" state).

Accordingly, if the program verify threshold value during the write/erase test is set at PVT2, the difference between the threshold value of the memory cells in the program state and that of the memory cells in the erase state during the write/erase test, i.e., the difference between the lower limit PVT2 of the threshold voltage distribution of the memory cells in the program state and the upper limit EVT2 of the threshold voltage distribution of the memory cells in the erase state can be made equal to the difference between the threshold value of the memory cells in the program state and that of the memory cells in the erase state during the normal operation, i.e., the difference between the lower limit PVT1 of the threshold voltage distribution of the memory cells in the program state and the upper limit EVT1 of the threshold voltage distribution of the memory cells in the erase state as follows:

$$PVT2-EVT2=PVT1-EVT1.$$

In this way, if PVT2 is used as the program verify threshold value while the EVT2 is used as the erase verify threshold value, it is possible to make the quantity of charge passed through the tunnel oxide films of the memory cells substantially equal between the write/erase test and the normal operation, so that the reliability of the write/erase test (tunnel oxide film durability test) can be improved.

Next, an erase sequence to which the present invention is applied will be described hereinafter.

Figure 23:
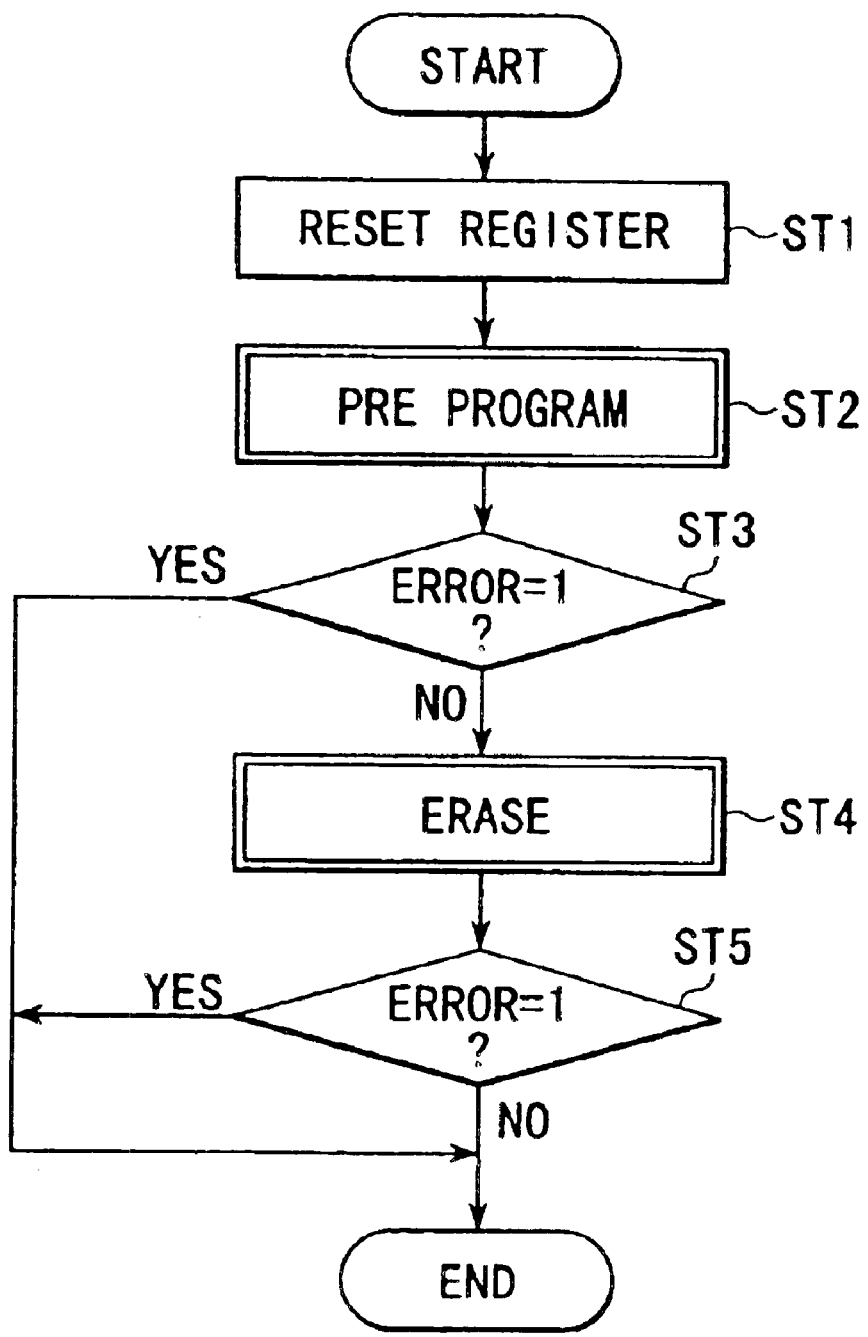
FIG. 23 shows an automatic erase sequence to which the present invention is applied.

FIG. 23 shows an example of the erase sequence to which the present invention is applied.

It is noted that each of the circuits referred to in the following description is that shown in FIG. 15.

First, when the command register 19 confirms an erase command and the block of the memory cell array 11 for which erase operation is to be executed, the control circuit 21 controls the operations of the respective circuits in the chip so as to execute the erase sequence shown in FIG. 23.

Specifically, after the address counter 16, the timer 25 and the like are reset, a pre-program step is executed for memory cells in a selected block (in steps ST1 to ST2).

Figure 24:
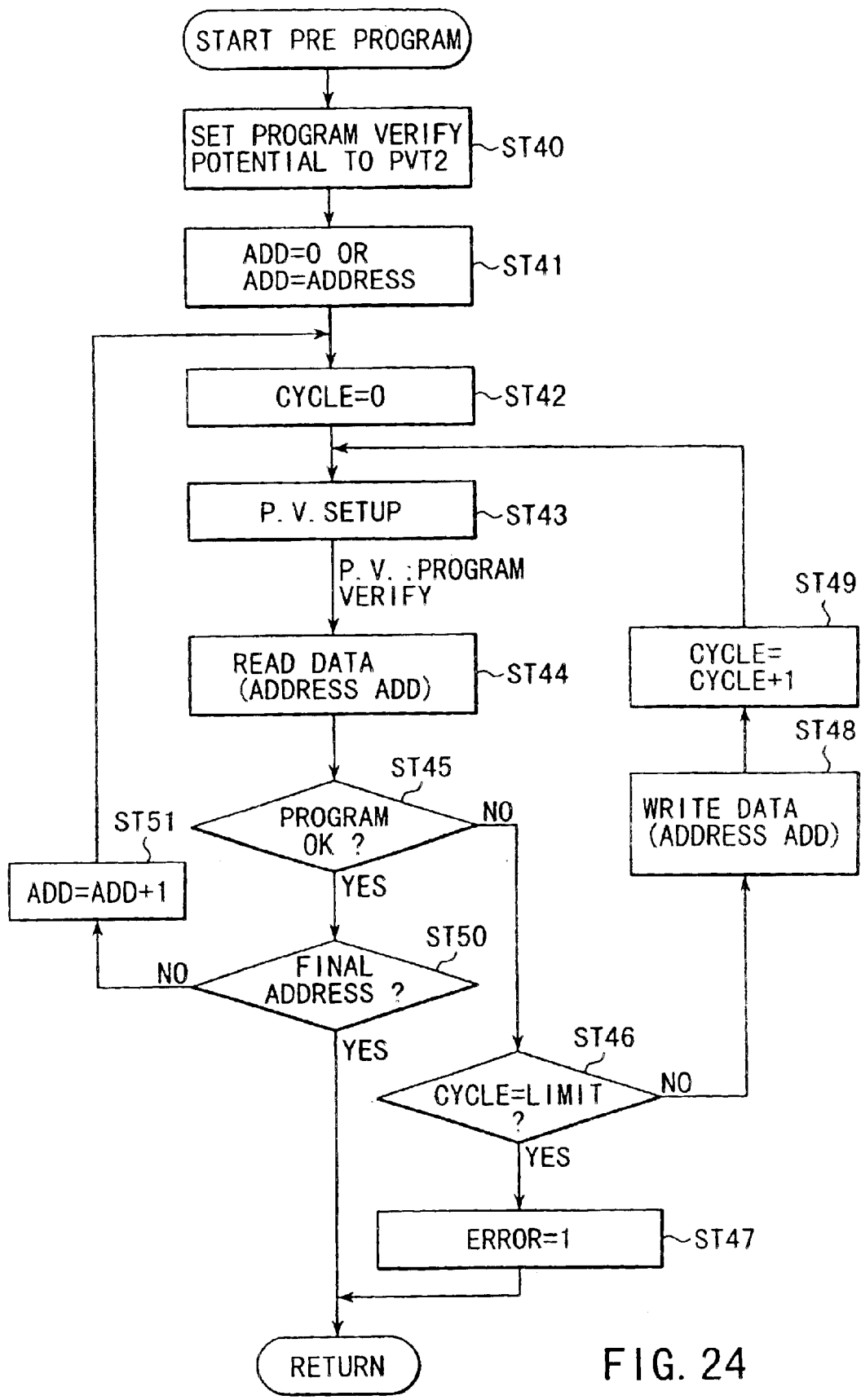
FIG. 24 is shows the sub-routine of a PROGRAM STEP.

The pre-program step is executed according to procedures shown in the sub-routine of FIG. 24.

First, the control signal PV is set at "1" and the control signal MD is set at "1" by the control circuit 21. By so setting, the program verify threshold value (threshold value) is switched to PVT2 (in step ST40).

Also, the address Add of the address counter 16 is set at an initial value "0" and the numerical value Cycle of the timer 25 (corresponding to the number of program steps) is set at an initial value "0" (in steps ST41 to ST42). In the potential generating circuit 22, internal power supply for program verify P. V. is set up (in step ST43).

Thereafter, the data of a memory cell selected by the address Add is read (in step ST44). The data of the memory cell (selected cell) selected by the address Add is compared with program data "0" (in step ST45).

Namely, it is assumed that a potential (program verify threshold value) PTV2 which is the lower limit of the threshold values with which it can be determined that a memory cell is in a program state, is a boundary value. If the threshold value of the selected cell is higher than the boundary value, it is determined that the data of the selected cell is "0". If the threshold value of the selected cell is lower than the boundary value, it is determined that the data of the selected cell is "1".

If the data of the selected cell does not coincide with the program data "0", program NG is determined and a data program step (injection of electrons into a floating gate) is executed for the selected cell.

This data program step is repeatedly carried out until the Cycle reaches a preset number Limit and the data of the selected cell coincides with the program data "0" (in steps ST48 to ST49).

When the Cycle or the number of program steps conducted to the selected cell reaches the preset number Limit, the pre-program step is ended even if the data of the selected data does not coincide with the program data (in step ST46).

In this case, a signal ERROR indicating that a program error occurs is set at "1" (in step ST47).

On the other hand, if the data of the selected data coincides with the program data "0", it is determined that the program of the selected cell is OK and the address Add is advanced by one, whereby the same operation is carried out to a memory cell (selected cell) at the next address. At this moment, the numerical value of the timer 25 is reset at the initial value (in steps ST42 and ST51).

Figure 25:
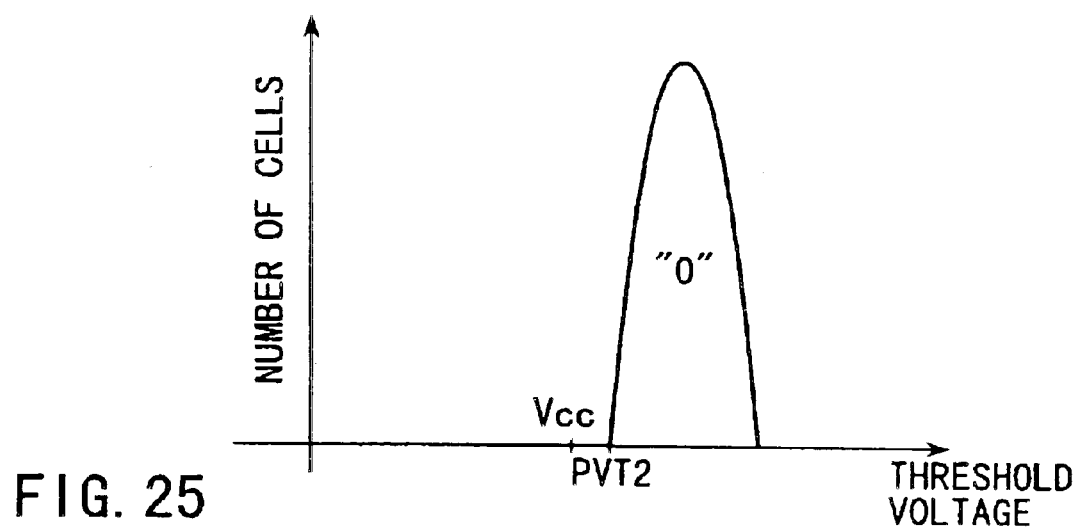
FIG. 25 shows the threshold voltage distribution of cells after the PROGRAM STEP.

If the data of the selected cell coincides with the program data "0" and the address Add corresponds to the final address in the block, then the pre-program step is ended. At this moment, the threshold voltage distribution of the memory cells in the selected block is that shown in FIG. 25 (in step ST50).

Next, it is checked whether or not the signal indicating the presence of a program error is "1". If a program error occurs, that is, the signal ERROR is "1", then the erase operation is ended (in step ST3).

If the pre-program step is surely executed, that is, the signal ERROR is "0", then an erase step is executed (in step ST4).

Figure 26:
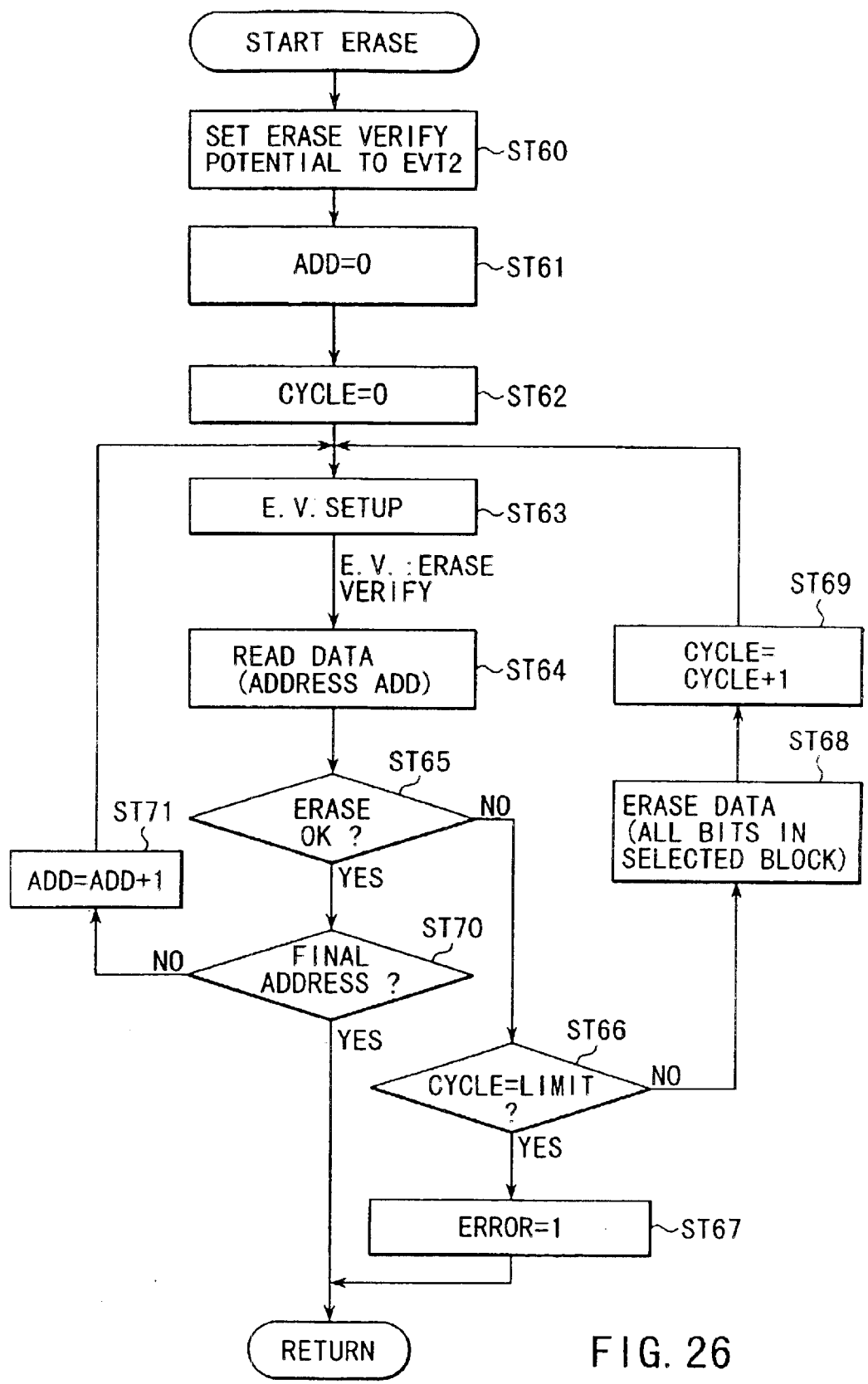
FIG. 26 shows the sub-routine of an ERASE STEP.

The eras step is executed according to procedures shown in the sub-routine of FIG. 26.

First, the control signal EV is set at "1" and the control signal MD is set at "1" by the control circuit 21. By so setting, the erase verify threshold value (threshold value) is switched to EVT2 (in step ST60).

Also, the address Add of the address counter 16 is set at the initial value "0" and the numerical value Cycle of the timer 25 (corresponding to the number of erase steps) is set at the initial value "0" (in steps ST61 to ST62). In the potential generating circuit 22, internal power supply for erase verify E. V. is set up (in step ST63).

Thereafter, the data of a memory cell selected by the address Add is read (in step ST64). The data of the memory cell (selected cell) selected by the address Add is compared with an expected value "1" (in step ST65).

That is, it is assumed that a potential (erase verify threshold value) EVT2 which is the upper limit of the threshold values with which it can be determined that a memory cell is in an erase state, is a boundary value. If the threshold value of the selected cell is higher than the boundary value, it is determined that the data of the selected cell is "0". If the threshold value of the selected cell is lower than the boundary value, it is determined that the data of the selected cell is "1".

If the data of the selected cell does not coincide with the expected value "1", erase NG is determined and a data erase step (an operation for taking out electrons in the floating gate) is executed to all the memory cells in the selected block.

Here, data erase is executed to all the memory cells in the selected block, which operation is peculiar to the flash EEPROM. Thus, the data erase step is executed even to the memory cells other than the selected cell in which data erase has been already completed.

This data erase step is repeatedly carried out until the Cycle reaches a preset number Limit and the data of the selected cell coincides with the expected value "1" (in steps ST66, ST68 and ST69).

When the Cycle or the number of program steps to the selected cell reaches the preset number Limit, the erase operation is ended even if the data of the selected cell does not coincide with the expected value "1" (in step ST66).

At this moment, a signal ERROR indicating that an erase step occurs is set at "1" (in step ST67).

On the other hand, if the data of the selected cell coincides with the expected value "1", erase OK is determined and the address Add is advanced by one, whereby the same operation is carried out to a memory cell (selected cell) at the next address. At this moment, the numerical value of the timer 25 is not reset at the initial value. This is because the erase operation is carried out to all memory cells (in step ST71).

Figure 27:
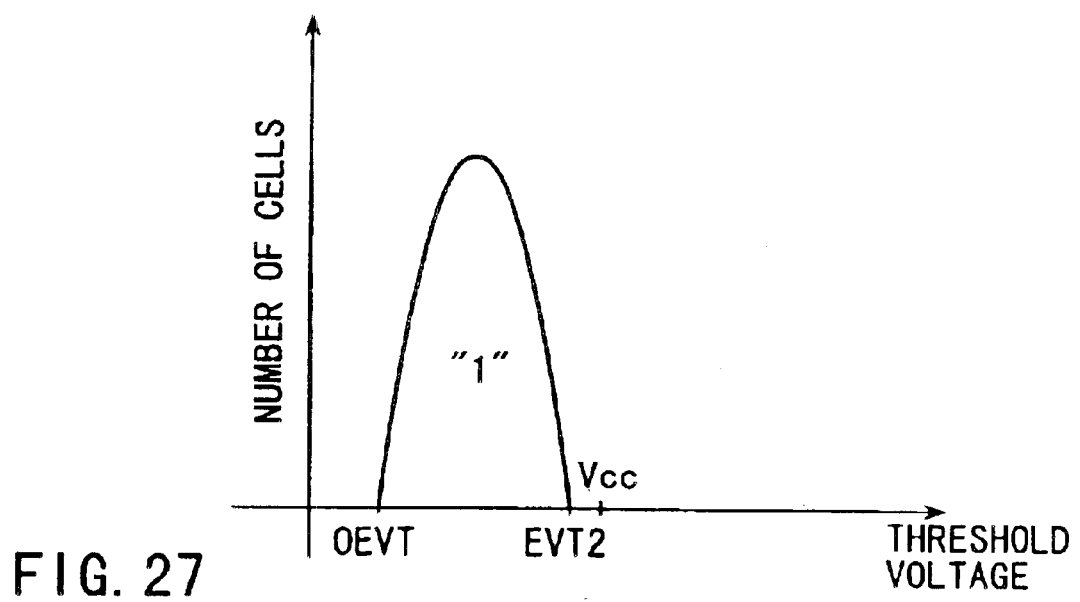
FIG. 27 shows the threshold voltage distribution of the cells after the ERASE STEP.

If the data of the selected cell coincides with the expected value "1" and the address Add corresponds to the final address in the block, then the erase operation is ended. At this moment, the threshold distribution of the memory cells in the selected block is that shown in, for example, FIG. 27. Namely, the lower limit of the threshold voltage distribution of the memory cells in the "1" state in the block does not go below the over-erase verify threshold value OEVT (in step ST70).

Next, it is checked whether or not the signal ERROR indicating the presence or absence is "1". If an erase error occurs, that is, the signal ERROR is "1", then the erase operation is ended (in step ST5).

Even if data erase is surely executed, that is, the signal ERROR is "0", the erase operation is ended without executing a convergence step (in step ST5).

Meanwhile, the erase sequence of the present invention is quite effective, as a product reliability test, for the write/erase test in which a program operation and an erase operation are repeatedly conducted.

That is, during the normal operation, if the control signal PV or the control signal EV is "1", the control signal MD is set at "0" and the normal program verify threshold value PVT1 or the erase verify threshold value EVT1 is used. In addition, during the write/erase test, if the control signal PV or the control signal EV is "1", the control signal MD is set at "1" and the program verify threshold value PVT2 or the erase verify threshold value EVT2 higher than the PVT1 or EVT1, respectively, is used.

Figure 28:
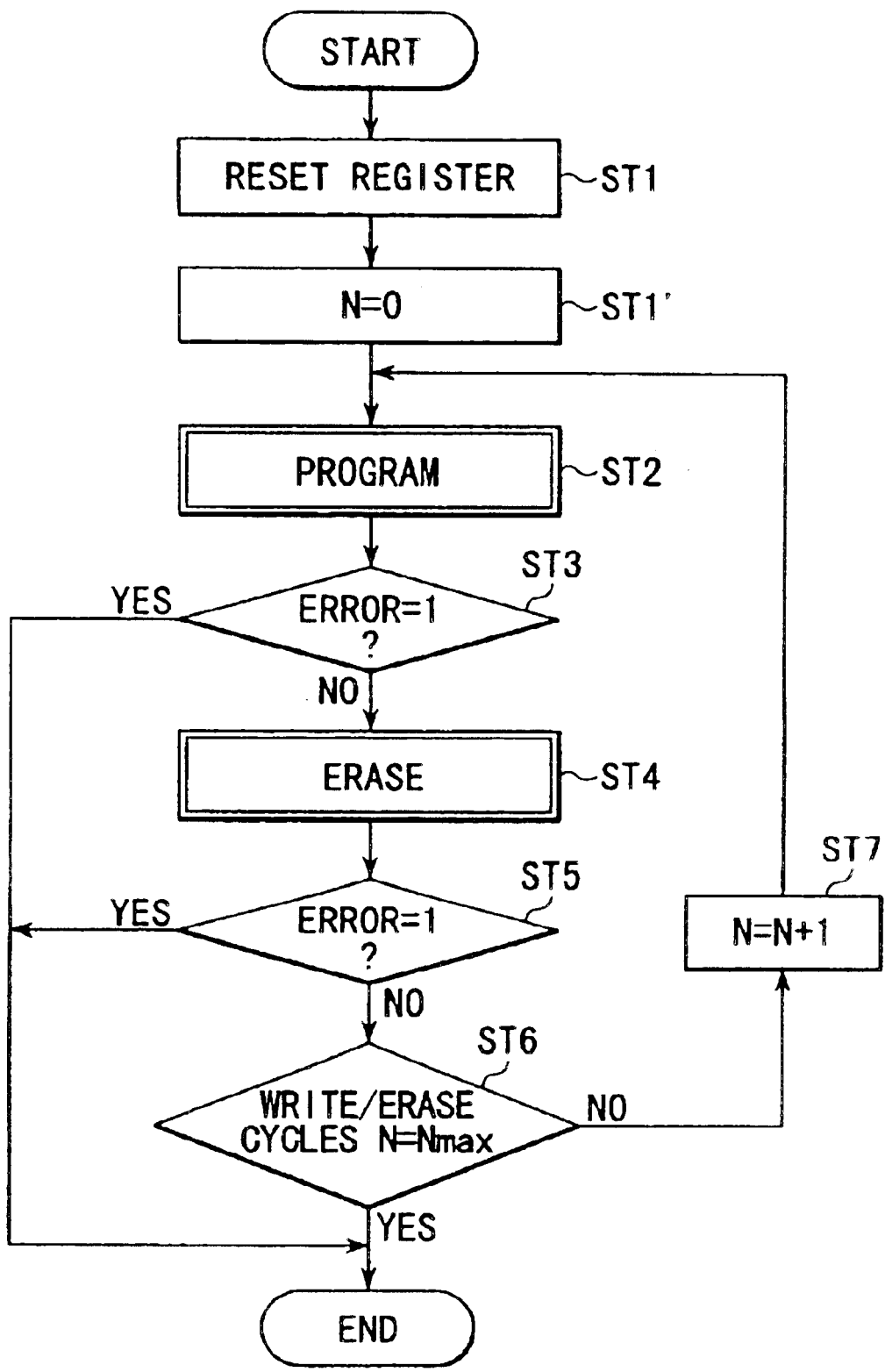
FIG. 28 shows the sequence of a program test to which the present invention is applied.

FIG. 28 shows the sequence of a write/erase test to which the present invention is applied.

It is noted that each of the circuits referred to in the following description is that shown in FIG. 15.

First, the address counter 16, the timer 25 and the like are reset and the number N of write/erase cycles is set at "0". Then, a program step is executed to memory cells in a selected block (in steps ST1 to ST2).

The program step is executed according to procedures shown in the sub-routine of FIG. 24.

First, the control circuit 21 sets the control signal PV at "1" and the control signal MD at "1". By so setting, the program verify threshold value (threshold value) is switched to PVT2 (in step ST40).

Also, the address Add of the address counter 16 is set at the initial value "0" and the numerical value Cycle of the timer 25 (corresponding to the number of program steps) is set at the initial value "0" (in steps ST41 to ST42). In the potential generating circuit 22, internal power supply for program verify P. V. is set up (in step ST43).

Thereafter, the data of a memory cell selected by the address Add is read (in step ST44). The data of the memory cell (selected cell) selected by the address Add is compared with program data "0" (in step ST45).

That is, it is assumed that a potential (program verify threshold value) PTV2 which is the lower limit of the threshold values with which it can be determined that a memory cell is in a program state, is a boundary value. If the threshold value of the selected cell is higher than the boundary value, it is determined that the data of the selected cell is "0". If the threshold value of the selected cell is lower than the boundary value, it is determined that the data of the selected cell is "1".

If the data of the selected cell does not coincide with the program data "0", program NG is determined and a data program step (injection of electrons in the floating gate) is executed to the selected cell.

This data program step is repeatedly carried out until the Cycle reaches a preset number Limit and the data of the selected cell coincides with the program data "0" (in steps ST48 to ST49).

When the Cycle or the number of program steps conducted to the selected cell reaches the preset number Limit, the pre-program step is ended even if the data of the selected data does not coincide with the program data (in step ST46).

In this case, a signal ERROR indicating that a program error occurs is set at "1" (in step ST47).

On the other hand, if the data of the selected data coincides with the program data "0", program OK is determined and the address Add is advanced by one, whereby the same operation is carried out to a memory cell (selected cell) at the next address. At this moment, the numerical value of the timer 25 is reset at the initial value (in steps ST42 and ST51).

If the data of the selected cell coincides with the program data "0" and the address Add corresponds to the final address in the block, then the pre-program step is ended. At this moment, the threshold voltage distribution of the memory cells in the selected block is that shown in FIG. 25 (in step ST50).

Next, it is checked whether or not the signal ERROR indicating the presence of a program error is "1". If a program error occurs, that is, the signal ERROR is "1", then the product is determined as a defective product and the write/erase test is ended (in step ST3).

If the program step is surely executed, that is, the signal ERROR is "0", then an erase step is executed (in step ST4).

The erase step is executed according to procedures shown in the sub-routine of FIG. 26.

First, the control signal EV is set at "1" and the control signal MD is set at "1" by the control circuit 21. By so setting, the erase verify threshold value (threshold value) is switched to EVT2 (in step ST60).

Also, the address Add of the address counter 16 is set at the initial value "0" and the numerical value Cycle of the timer 25 (corresponding to the number of erase steps) is set at an initial value "0" (in steps ST61 to ST62). In the potential generating circuit 22, internal power supply for erase verify E. V. is set up (in step ST63).

Thereafter, the data of a memory cell selected by the address Add is read (in step ST64). The data of the memory cell (selected cell) selected by the address Add is compared with an expected value "1" (in step ST65).

That is, it is assumed that a potential (erase verify threshold value) EVT2 which is the upper limit of the threshold values with which it can be determined that a memory cell is in an erase state, is a boundary value. If the threshold value of the selected cell is higher than the boundary value, it is determined that the data of the selected cell is "0". If the threshold value of the selected cell is lower than the boundary value, it is determined that the data of the selected cell is "1".

If the data of the selected cell does not coincide with the expected value "1", erase NG is determined and a data erase step (an operation for taking out electrons in the floating gate) is executed to all the memory cells in the selected block.

Here, data erase is executed to all the memory cells in the selected block, which operation is peculiar to the flash EEPROM. Thus, the data erase operation is executed even to the memory cells other than the selected cell in which data erase has been already completed.

This data erase operation is repeatedly carried out until the Cycle reaches a preset number Limit and the data of the selected cell coincides with the expected value "1" (in steps ST66, ST68 and ST69).

When the Cycle or the number of erase steps to the selected cell reaches the preset number Limit, the erase operation is ended even if the data of the selected cell does not coincide with the expected value "1" (in step ST66).

In this case, a signal ERROR indicating that an erase step occurs is set at "1" (in step ST67).

On the other hand, if the data of the selected cell coincides with the expected value "1", erase OK is determined and the address Add is advanced by one, whereby the same operation is carried out to a memory cell (selected cell) at the next address. At this moment, the numerical value of the timer 25 is not reset at the initial value. This is because the erase operation is carried out to all memory cells (in step ST71).

If the data of the selected cell coincides with the expected value "1" and the address Add corresponds to the final address in the block, then the erase operation is ended. At this moment, the threshold distribution of the memory cells in the selected block is that shown in, for example, FIG. 27. Namely, since the lower limit of the threshold voltage distribution of the memory cells in the "1" state in the block does not go below the over-erase verify threshold value OEVT, there is no need to execute a convergence step (in step ST70).

Next, it is checked whether or not the signal ERROR indicating the presence or absence is "1". If an erase error occurs, that is, the signal ERROR is "1", then the product is determined as a defective product and the write/erase test is ended (in step ST5).

If data erase is surely executed, that is, the signal ERROR is "0", then it is checked whether or not the number N of write/erase cycles becomes a maximum value Nmax. If the number N of write/erase cycles does not reach the maximum value Nmax, the above-stated program step and erase step are executed again.

If the number N of write/erase cycles reaches the maximum value Nmax, the product is determined as a non-defective product and the write/erase test is ended (in step ST5).

As stated so far, the nonvolatile semiconductor memory according to the present invention is capable of generating not only the normal program verify threshold value PVT1 and the normal erase verify threshold value EVT1 but also the program verify threshold value PVT2 and the erase verify threshold value EVT2 higher than PVT1 and EVT1, respectively.

If the erase operation is carried out while using, for example, the program verify threshold value PVT2 and the erase verify threshold value EVT2, memory cells in an over-erase state do not occur and it is, therefore, possible to eliminate a convergence step. This makes it possible to thereby complete the erase operation in shorter time.

In the flash EEPROM, in particular, a write/erase test (tunnel oxide film durability test) is conducted as a reliability test. If EVT2 is used as the erase verify threshold value during the write/erase test, it is not necessary to execute a convergence test during the erase operation. This makes it, therefore, possible to greatly shorten test time and reduce test cost. Furthermore, if PVT2 is used as the program verify threshold value during the write/erase test, the quantity of charge (which can be replaced by the difference in threshold value PVT2−EVT2) passed through tunnel oxide films during the write/erase test can be made equal to the quantity of charge passed through the tunnel oxide films during the normal operation (PVT1−EVT1). Hence, the reliability of the write/erase test can be improved.

Meanwhile, the write/erase test is to repeatedly conduct the program operation and the erase operation and to determine whether the data of the selected cell is "0" or "1" by the program verify threshold value (threshold value) and the erase verify threshold value (threshold value). That is to say, during the write/erase test, since the read potential Vcc which serves as a reference (threshold value) for judging whether the selected cell data is "0" or "1" is not used, the write/erase test can be conducted without difficulty.

Hence, by using PVT2 and EVT2 during the write/erase test, it is possible to shorten test time. By using PVT1 and EVT1 during the normal operation, it is possible to deal with the lowered voltage of the power supply potential (read potential) Vcc. Needless to say, the normal operation requires that the erase operation includes a convergence step.

[B]

Now, a nonvolatile semiconductor memory according to the present invention will be described in detail with reference to the accompanying drawings.

The present invention relates to a potential generating circuit for generating a read potential (which is applied to the word line of a selected cell) in a read mode.

In case of an NOR-type flash EEPROM having binary data ("1" and "0") stored in one memory cell, for example, the threshold value of a memory cell in a "1" state is set to fall within a predetermined range (positive value range) and that of a memory cell in a "0" state is set to be equal to or higher than the upper limit of this predetermined range. In the read mode, the potential of the word line of a selected cell is set at a read potential Vread between the threshold value of the memory cell in the "1" state and that of the memory cell in the "0" state, the potential of the word line of an unselected cell is set at a ground potential Vgnd, and a sense amplifier detects the potential change of a bit line, thereby determining the state of a memory cell.

In recent years, an external power supply potential Vcc is lower and lower and the a read potential Vread (e.g., about 5V) is generated by boosting the external power supply potential Vcc (e.g., about 2V) using a booster (charger pump circuit) within the potential generating circuit. Also, in the read mode, the potential generating circuit turns into an active state for a given period of time after the change of the external addresses signal ADDi and the read potential Vread is generated. If the external address signals ADDi are not changed over the given period of time after the change of the external address signals ADDi, the potential generating circuit is set in a standby state to thereby reduce current consumption during the read operation.

Here, the active state means a state in which the row decoder is in an operative state and the read potential Vread is generated by the first potential generator having strong driving force (high current consumption). In this case, due to the operative row decoder, a large load (selected word line) is electrically connected to the potential generating circuit and the read potential Vread is transmitted to the selected word line.

Further, the standby mode means a state in which the row decoder is in an inoperative state and the read potential Vread is generated only by the second potential generator having small driving force (low current consumption). In this case, due to the inoperative row decoder, a large load (selected word line) is not electrically connected to the potential generating circuit. The second potential generator functions to maintain the potential of the output node of the potential generating circuit to be the read potential Vread in preparation for the next read operation.

According to the conventional potential generating circuit, however, the first potential generator having strong driving force is always operative (so is the second potential generator) in the active state. In the standby state, only the second potential generating circuit having small driving force is operative (and the first potential generator is inoperative).

In that case, if the potential of the output node of the potential generating circuit is lower than the read potential Vread when the state of the potential generator circuit is changed from the active state to the standby state, the potential of the output node of the potential generating circuit is boosted to the read potential only by the second potential generator having small driving force. Due to this, when the next read operation starts, that is, when the external address signals ADDi are changed and the potential generating circuit returns to the active state, the potential of the output node of the potential generating circuit may sometimes remain lower than the read potential Vread. If so, in the next read operation, for example, the potential of the selected word line is not sufficiently boosted, which may have an adverse effect on the read operation such as causing a read error.

The present invention has been made to solve the above-stated disadvantages. It is, therefore, an object of the present invention to turn the first potential generator into an inoperative state after the potential of the output node of a potential generating circuit becomes a read potential without turning the first potential generator having strong driving force into an inoperative state even if the potential of the output node of the potential generating circuit is lower than the read potential while external address signals are not changed for a predetermined time and the state of the potential generating circuit is moved from an active state to a standby state in a read mode.

Figure 29:
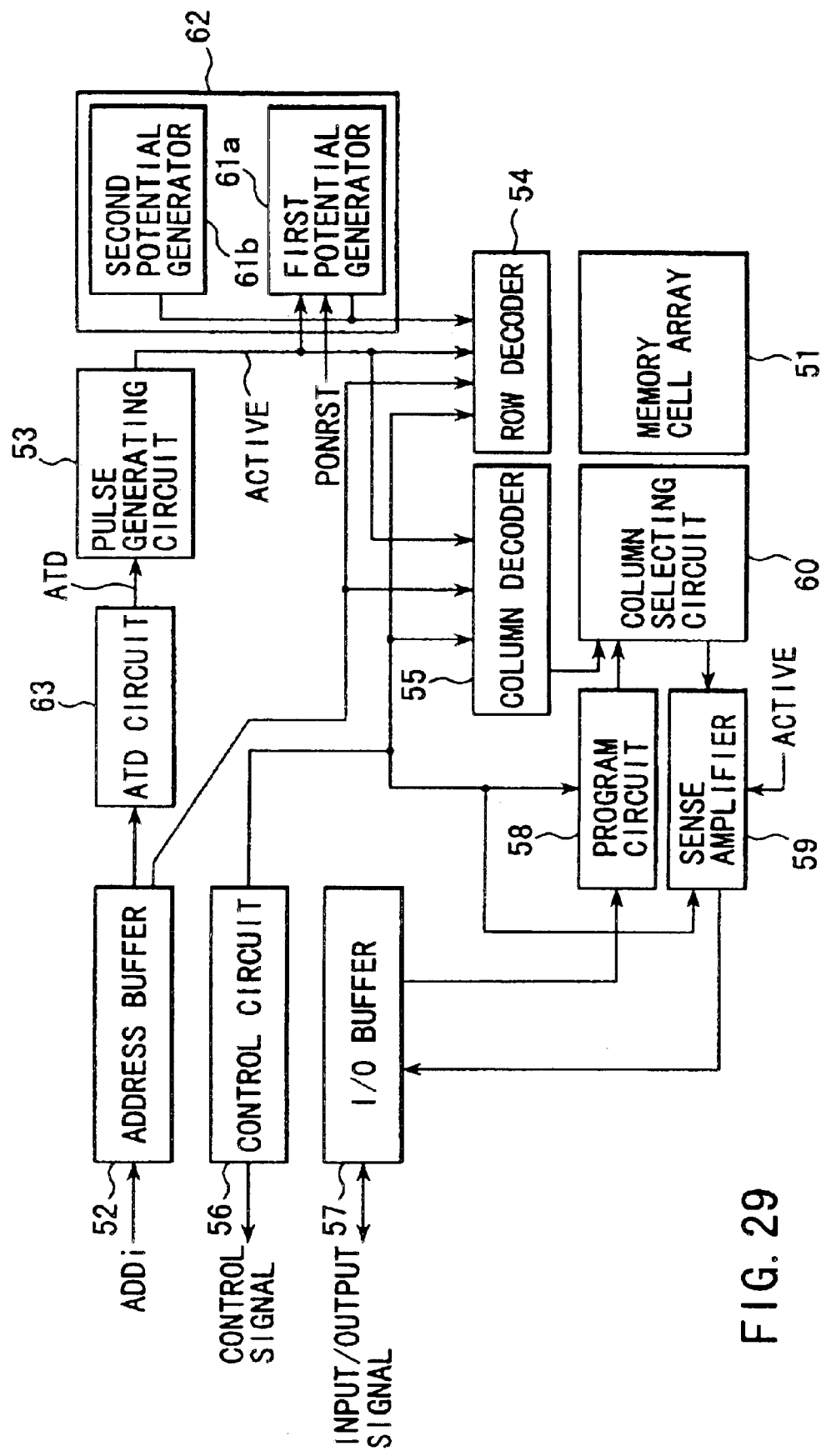
FIG. 29 is a block diagram showing the important parts of a flash memory according to the present invention.

FIG. 29 shows the important parts of an NOR-type flash EEPROM according to the present invention.

A memory cell array 51 consists of, for example, NOR cells connected between word lines and bit lines. External address signals ADDi are inputted to an address buffer 52. The address buffer 52 functions as a buffer for inputting the external address signals ADDi in a memory chip. Among the external address signals ADDi, a row address signal is inputted to a row decoder 54 and a column address signal is inputted to a column decoder 55.

An ATD (Address Transition Detection) circuit 63 outputs a pulse signal ATD when detecting the change of the external address signals ADDi. The pulse signal ATD is inputted to a pulse generating circuit 53. When receiving the pulse signal ATD, the pulse generating circuit 53 outputs a pulse signal ACTIVE.

The pulse signal ACTIVE is inputted to a potential generating circuit 62, the row decoder 54 and the column decoder 55.

While the pulse signal ACTIVE is being inputted to the row decoder 54 and the column decoder 55 (during ACTIVE="H"), the row decoder 54 and the column decoder 55 are operative. Thus, the row decoder 54 selects a word line based on the row address signal among the external address signals ADDi. The selected word line is electrically connected to the potential generating circuit 62.

At ACTIVE="L", the row decoder 54 and the column decoder 55 inoperative.

While the pulse signal ACTIVE is being inputted to the potential generating circuit 62 (during ACTIVE="H"), the potential generating circuit 62 is in an active state. Thus, the first potential generator 61a having strong driving force is operative. At this moment, the second potential generator 61b having small driving force in the potential generating circuit 62 is, for example, operative, as well (note that the second potential generator 61b is always, for example, operative).

Further, at ACTIVE="L", the potential generating circuit 62 is in a standby state. In principle, when the pulse signal is ACTIVE="L", the first potential generator 61a having strong driving force in the potential generating circuit 62 is in inoperative. At this moment, only the second potential generator 61b having small driving force is operative in the potential generating circuit 62.

However, even at ACTIVE="L", if the potential of the output node of the potential generating circuit 62 is lower than the read potential Vread, the first potential generator 61a having strong driving force is not inoperative. In that case, the potential of the output node of the potential generating circuit 62 is equal to the read potential Vread and then the first potential generator 61a is made inoperative.

While the function of the potential generating circuit 62 of the present invention is as stated above, the specific example of a circuit arrangement for realizing this function will be described later in detail.

A control circuit 56 controls the operations of the row decoder 54, the column decoder 55, a program circuit 58 and a sense amplifier 59 in accordance with an operation mode. In a program mode, for example, the row decoder 54, the column decoder 55 and the program circuit 58 turn into an operative state, and program data is transferred to the memory array 51 from the outside of the memory chip by way of an input/output (I/O) buffer 57, the program circuit 58 and a column selecting circuit 60. In a read mode, for example, the row decoder 54, the column decoder 55 and the sense amplifier 59 turn into an operative state and read data is outputted from the memory cell array 51 to the outside of the memory chip by way of the column selecting circuit 60, the sense amplifier 59 and the input/output (I/O) buffer 57.

Figure 30:
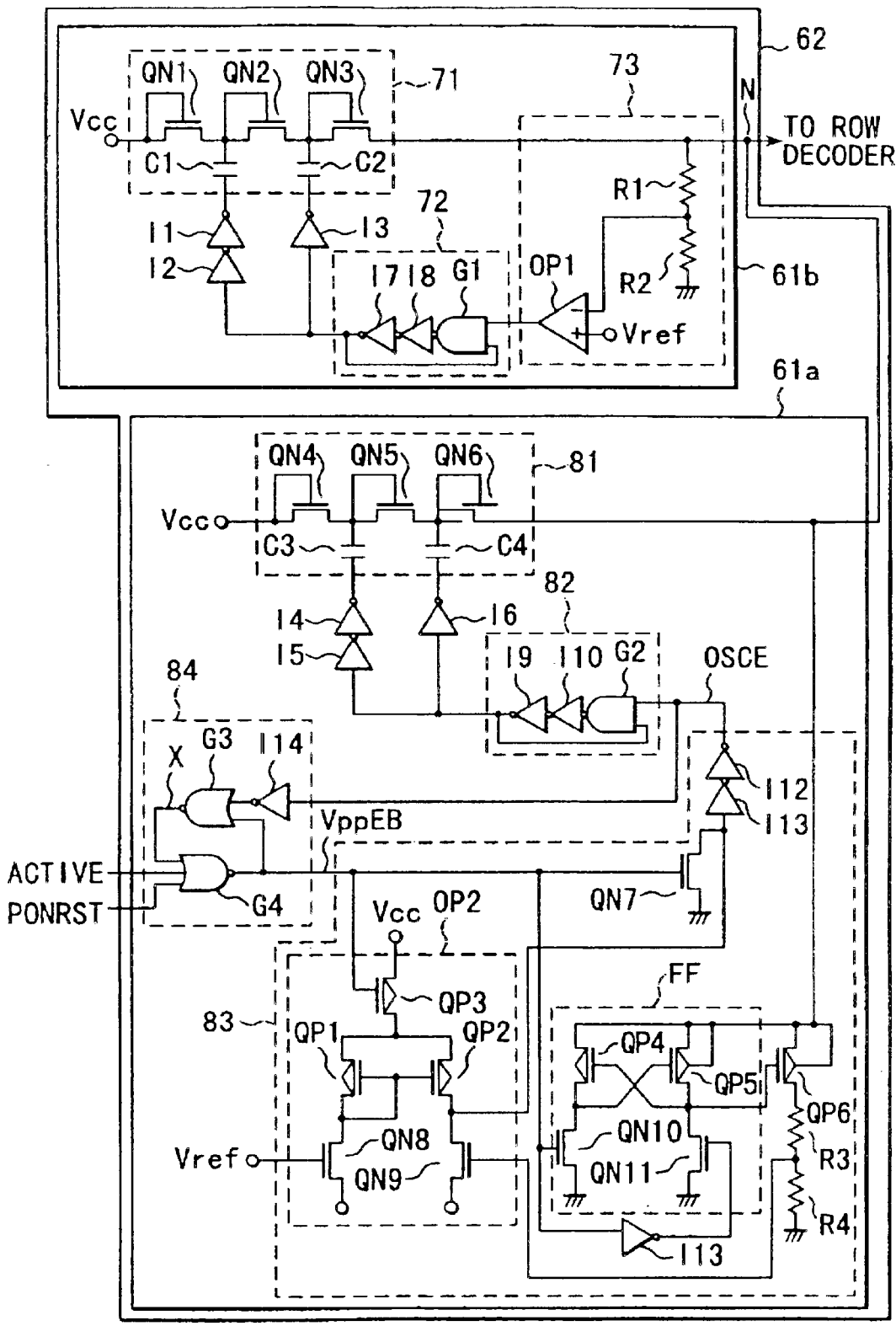
FIG. 30 shows the specific example of a potential generating circuit shown in FIG. 29.

FIG. 30 shows the specific example of the potential generating circuit 62 shown in FIG. 29.

The potential generating circuit 62 consists of the first potential generator 61a and the second potential generator 61b as stated above. Now, an example of the first potential generator 61a and that of the second potential generator 61b will be sequentially described. In this example, it is assumed that an active state means a state in which the row decoder is operative at ACTIVE="H". A standby state means a state in which the row decoder is inoperative at ACTIVE="L".

The first potential generator 61a is a potential generator having strong driving force for the active state. The first potential generator 61a consists of a booster (charge pump circuit) 81, a ring oscillator 82, a detector 83 and a control circuit 84.

As is well known, the booster 81 consists of a plurality of N channel type MOS transistors QN4, QN5 and QN6 connected in series and capacitors C3 and C4 connected to the connection nodes of the MOS transistors QN4 and QN5 and QN6. The sources and gates of the MOS transistors QN4, QN5 and QN6 are mutually connected and an external power supply potential Vcc is inputted to a source side input node.

The ring oscillator 82 consists of an NAND circuit G2 and inverters I9 and I10. The output signal of the ring oscillator 82 is inputted to one end of the capacitor C3 through inverters I4 and I5 and to one end of the capacitor C4 through an inverter I6.

The detector 83 consists of a flip-flop circuit FF, an operational amplifier OP2, resistors R3 and R4, inverters I11 and I12 and MOS transistors QN7 and QP6.

The flip-flop circuit FF consists of P channel type MOS transistors QP4, QP6 and N channel type MOS transistors QN10 and QN11. The flip-flop circuit FF on/off-controls the MOS transistor QP6 based on the value of the output signal VppEB (either "H" or "L") of the control circuit 84. That is, when the value of the output signal VppEB of the control circuit 84 is "H", the flip-flop circuit FF turns off the MOST transistor QP6. When the value of the output signal VppEB of the control circuit 84 is "H", the flip-flop circuit FF turns on the MOS transistor QP6.

As is well known, the operational amplifier OP2 consists of P channel type MOS transistors QP1, QP2 and QP3, and N channel type MOS transistors QN8 and QN9. If the gate potential of the MOS transistor QN9 is lower than a reference potential Vref, the operational amplifier QP2 outputs "H". If the gate potential thereof is higher than the reference potential Vref, the operational amplifiers OP2 outputs "L".

The resistors R3 and R4 function to detect the potential of the output node N of the potential generating circuit 62 and to transmit the result to the input node of the operational amplifier OP2. As stated above, the operational amplifier OP2 compares the reference potential Vref with the potential of the input node (which potential depends on the potential of the node N) and transmits the result to the ring oscillator 82.

If the potential of the output node N of the potential generating circuit 62 is, for example, lower than the read potential Vread, the operational amplifier OP2 outputs "H". When passed through the inverters I11 and I12, the output signal of the operational amplifier OP2 turns into a signal OSCE. If the signal OSCE is "H", the ring oscillator 82 becomes operative. In addition, if the potential of the output node N of the potential generating circuit 62 is substantially equal to the read potential Vread, the operational amplifier OP2 outputs "L". At this moment, the signal OSCE becomes "L" and the ring oscillator 82 becomes inoperative.

The control circuit 84 consists of NOR circuits G3 and G4, and an inverter I14. Signals ACTIVE and PONRST are inputted to the NOR circuit G4. As stated above, the signal ACTIVE is a signal which turns into "H" only for a predetermined time after the change of the external address signals ADDi. The signal PONRST is a reset signal for resetting the state of the control circuit 84. The signal OSCE for controlling the operation of the ring oscillator 82 is inputted to the NOR circuit G3 through the inverter I14.

The output signal VppEB of the control circuit 84 turns into "H" when all of the three input signals of the NOR circuit G3 become "L". When the output signal VppEB becomes "H", the first potential generator 61a turns into an inoperative state. The operation of the first potential generator 61a will be described later in detail.

In an active state (in which the row decoder is operative and the selected word line is electrically connected to the potential generating circuit 62), the first potential generator 61a functions to set the potential of the output node N of the potential generating circuit 62 at the read potential Vread. When the potential of the output node N becomes lower than the read potential Vread, the first potential generator 61a functions to promptly return the potential thereof to the read potential Vread. Owing to this, the resistance values of the resistors R3 and R4 are set low and the current value of a current flowing through the resistors R1 and R2 is set high (e.g., about 10E-5[A]).

Basically, therefore, in the active state, the first potential generator 61a is made operative to thereby stabilize the potential of a selected word line. In a standby state, the first potential generator 61a is made inoperative to thereby reduce current consumption.

The second potential generator 61b is a potential generator having small driving force for a standby state. The second potential generator 61b consists of a booster (charge pump circuit) 71, a ring oscillator 72 and a detector 73.

As is well known, the booster 71 consists of a plurality of N channel type MOS transistors QN1, QN2 and QN3 connected in series, and capacitors C1 and C2 connected to the connection nodes of the MOS transistors QN1, QN2 and QN3. The sources and gates of the MOS transistors QN1, QN2 and QN3 are mutually connected and an external power supply potential Vcc is inputted to a source side input node.

The ring oscillator 72 consists of an NAND circuit G1 and inverters I7 and I8. The output signal of the ring oscillator 72 is inputted to one end of the capacitor C1 through inverters I1 and I2 and to one end of the capacitor C2 through an inverter I3.

The detector 73 consists of an operational amplifier OP1 and resistors R1 and R2. The resistors R1 and R2 function to detect the potential of the output node N of the potential generating circuit 62 and to transmit the result to the negative side input node of the operational amplifier OP1. The operational amplifier OP1 compares the reference potential (the potential of a positive side input node) with the negative side input node (which depends on the potential of the node N) and transmits the result to the ring oscillator 72.

If the potential of the output node N of the potential generating circuit 62 is, for example, lower than the read potential Vread, the operational amplifier OP1 outputs "H" to make the ring oscillator 72 operative. If the potential of the output node N of the potential generating circuit is substantially equal to the read potential Vread, the operational amplifier OP1 outputs "L" to make the ring oscillator 72 inoperative.

In the second potential generator 61b, the detector 73 is always operative. That is, the detector 73 always detects the potential of the output node N of the potential generating circuit 62 both in the active state and in the standby state. In other words, the resistors R1 and R2 are always applied with current. Accordingly, in the detector 73 of the second potential generator 61b, it is necessary that the resistance values of the resistors R1 and R2 are set as high as possible and the current value of the current flowing through the resistors R1 and R2 is set low (e.g., at several nA to several $\mu$A) so as to reduce current consumption.

Here, the reason for always making the detector 73 of the second potential generator 61b operative is to smoothly transition the state of the potential generating circuit 62 from the active state to the standby state. That is, if only the detector 83 of the first potential generator 61a is made operative in the active state and only the detector 73 of the second potential generator 61b is made operative in the standby state, then it is necessary to take account of time for making the detector 73 of the second potential generator 61b operative at the time of transitioning the state of the potential generating circuit 62 from the active to standby state.

Next, the operation of the potential generating circuit 62 shown in FIG. 30 will be described.

First, the signal PONRST turns into "H" and the value of the output signal VppEB of the control circuit 84 is reset. Since the output signal VppEB is "L", the operational amplifier OP2 becomes operative and the MOS transistor QP6 is turned on. The MOS transistor QN7 is turned off. Thereafter, the signal PONRST turns into "L".

If the external address signals ADDi are changed, the signal ACTIVE turns into "H" (in an active state) only for a certain time after the change of the external address signals ADDi. While the signal ACTIVE is "H", the value of the output signal VppEB of the control circuit 84 is maintained "L", so that the operational amplifier OP2 remains operative and the MOS transistor OP6 remains on.

Therefore, if the potential of the output node N of the potential generating circuit 62 is lower than the read potential Vread, the operational amplifier OP2 outputs "H". At this moment, since the signal OSCE is "H", the ring oscillator 82 becomes operative. Namely, the potential of the output node N is boosted to the read potential Vread by the first potential generator 61a.

Further, if the potential of the output node N of the potential generating circuit 62 is substantially equal to the read potential Vread, the operational amplifier outputs "L". At this moment, since the signal OSCE is "L", the ring oscillator 82 becomes inoperative.

After a predetermined time has passed since the change of the external address signals ADDi, the signal ACTIVE turns into "L" (in a standby state). When the signal ACTIVE becomes "L", the two input signals (ACTIVE, PONRST) of the NOR circuit G4 turn into "L". Since the remaining one input signal X is "H" (OSCE="H" and VppEB="L"), the value of the output signal VppEB of the control circuit 84 remains "L". Due to this, the operational amplifier OP2 remains operative and the MOS transistor QP6 remains on.

Here, if the potential of the output node N of the potential generating circuit 62 is lower than the read potential Vread, the operational amplifier OP2 outputs "H". At this moment, since the signal OSCE is "H", the ring oscillator 82 becomes operative. Namely, even after the state of the potential generating circuit 62 turns into the standby state, the potential of the output node N is booted to the read potential Vread by the first potential generator 61a.

Further, if the potential of the output node N of the potential generating circuit 62 is substantially equal to the read potential Vread, the operational amplifier OP2 outputs "L". At this moment, since the signal OSCE is "L", the ring oscillator 82 becomes inoperative. Further, at this moment, since the output signal X of the NOR circuit G3 becomes "L", all the input signals (ACTIVE, PONRST, X) of the NOR circuit G4 become "L" and the value of the output signal VppEB of the control circuit 84 become "H". Thus, the operational amplifier OP2 becomes inoperative and the MOS transistor QP6 is turned off.

As a result, the first potential generator 61a becomes inoperative and only the second potential generating circuit 61b becomes operative.

Thereafter, if the external address signals ADDi are changed again and the signal ACTIVE becomes "H", then the value of the output signal VppEB of the control circuit 84 becomes "L" and the first potential generator 61a becomes operative.

As described above, according to the potential generating circuit of the present invention, in the read mode, when the potential generating circuit 62 is in the active state, both the first and second potential generators 61a and 61b are operative. Due to this, if the potential of the output node N of the potential generating circuit 62 is lower than the read potential Vread, the potential can be promptly boosted to the read potential Vread by the first potential generator 61a having strong driving force.

Further, if the potential of the output node N of the potential generating circuit 62 is substantially equal to the read potential Vread in the standby state, the potential can be maintained to be the read potential Vread by the second potential generator 61b having small driving force.

Moreover, according to the present invention, even in the standby state, if certain conditions are met, the first potential generator 61a becomes operative. That is, the potential of the output node N of the potential generating circuit 62 is lower than the read potential Vread, both the first and second potential generators 61a and 61b become operative even in the standby state and the potential of the output node N of the potential generating circuit 62 can be promptly boosted to the read potential Vread by the first potential generator 61a having strong driving force.

Figure 31:
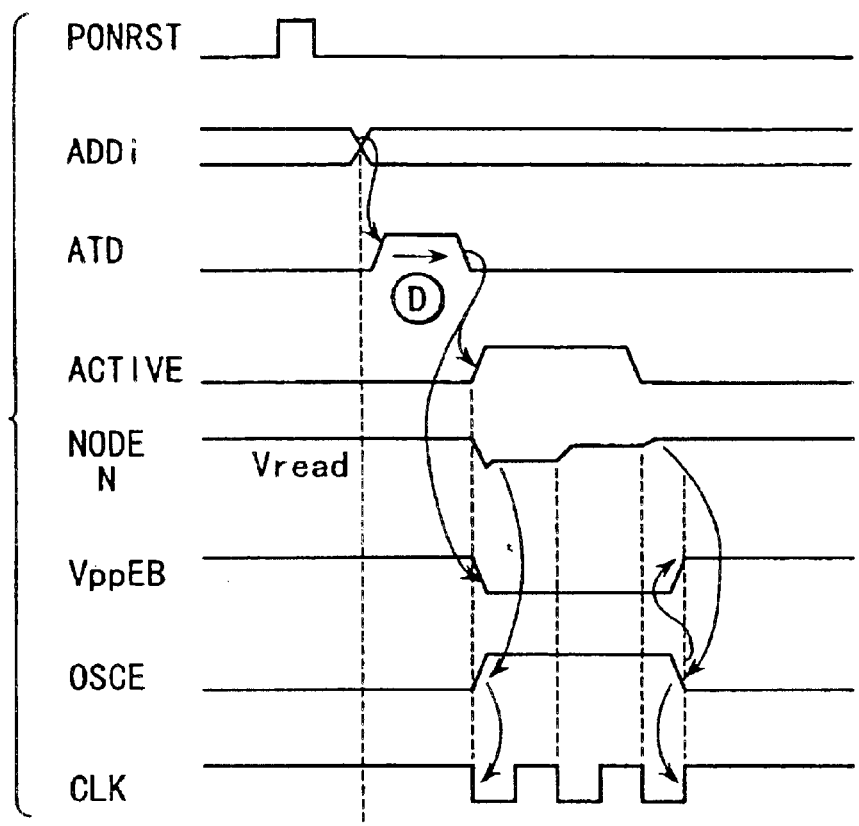
FIG. 31 is a waveform view showing the operation of the memory shown in FIG. 29.

Next, the specific example of the operation of the flash memory shown in FIGS. 29 and 30 in an actual read mode will be described with reference to FIGS. 29 to 31.

In the read mode, first, the signal PONRST becomes "H" and the value of the output signal VppEB of the control circuit 84 is reset at "L". The output signal VppEB is "L", so that the operational amplifier OP2 becomes operative and the MOS transistor QP6 is turned on. The MOS transistor QN7 is turned off. Thereafter, the signal PONRST turns into "L".

If external address signals ADDi are inputted from the outside of the memory chip (the external address signals ADDi are changed), a pulse signal ATD is outputted from the ATD circuit 63. Also, if the pulse signal ATD is inputted to the pulse generating circuit 53, the circuit 53 outputs a pulse signal ACTIVE. While the signal ACTIVE is "H", the row decoder 54 and the column decoder 55 are operative and the memory chip turns into an active state.

In this example, after a predetermined time has passed since the external address signals ADDi were inputted (which time corresponds to the time when the external address signals ADDi were changed), the signal ACTIVE turns into "H". Namely, if the active state and the standby state are repeated, it takes a predetermined delay time from the change of the external address signals ADDi until the signal ACTIVE turns into "H". However, if this delay time is ignored, the signal ACTIVE turns into "H" for a certain time after the change of the external address signals ADDi.

If the signal ACTIVE turns into "H" (in an active state), the row decoder 54 becomes operative and the word line (load) selected by the row address signal is electrically connected to the potential generating circuit 62 as stated above. Accordingly, the potential of the output node N of the potential generating circuit 62 is maintained to be Vread by the second potential generating circuit 61b before the signal ACTIVE turns into "H". After the signal ACTIVE turns into "H", a load is discharged to the selected word line and the potential of the output node N becomes lower than the read potential Vread.

On the other hand, while the signal ACTIVE is "H", the value of the output signal VppEB of the control circuit 84 is maintained "L". Due to this, the operational amplifier OP2 remains operative and the MOS transistor QP6 remains on. At this moment, therefore, both the first and second potential generators 61a and 61b are operative.

Here, as stated above, the potential of the output node N of the potential generating circuit 62 is lower than the read potential Vread. Owing to this, the potential of the output node N of the potential generating circuit 62 is boosted by the first and second potential generators 61a and 61b. It is noted that the boost operation at this time is carried out mainly by the first potential generator 61a having strong driving force.

In other words, in the first potential generator 61a, the operational amplifier OP2 outputs "H". At this moment, the signal OSCE is "H", so that the ring oscillator 82 becomes operative. That is to say, the potential of the output node N is boosted by the booster 81 in the first potential generator 61a.

In this example, before the potential of the output node N of the potential generating circuit 62 is boosted to the potential read Vread, the signal ACTIVE turns into "L" (in the standby state). At this moment, conventionally, the first potential generator 61a also becomes inoperative and, thereafter, the potential of the output node N of the potential generating circuit 62 is boosted to the read potential Vread only the second potential generator 61b.

According to the present invention, by contrast, even if the signal ACTIVE turns into "L" (in the standby state), the first potential generator 61a is not turned into an inoperative state while the potential of the output node N of the potential generating circuit 62 does not reach the read potential Vread. That is, even in the standby state, the potential of the output node N of the potential generating circuit 62 is boosted to the read potential Vread by both the first and second potential generators 61a and 61b.

To be specific, when the signal ACTIVE becomes "L", the two input signals (ACTIVE, PONRST) of the NOR circuit G4 turn into "L" and the remaining one input signal X is "H" (OSCE="H" and VppEB="L"). Due to this, the value of the output signal VppEB of the control circuit 84 remains "L". Accordingly, the operational amplifier OP2 remains operative and the MOS transistor QP6 remains on.

Since the potential of the output node N of the potential generating circuit 62 is lower than the read potential Vread, the operational amplifier OP2 outputs "H". At this moment, the signal OSCE is "H", so that the ring oscillator 82 becomes operative. That is, even after the state of the potential generating circuit 62 turns into a standby state, the potential of the output node N is boosted to the read potential Vread by the first potential generator 61a.

Thereafter, if the potential of the output node N of the potential generating circuit 62 becomes substantially equal to the read potential Vread, the operational amplifier OP2 outputs "L". At this moment, the signal OSCE is "L", so that the ring oscillator 82 becomes inoperative. Further, at this moment, the output signal X of the NOR circuit G3 turns into "L", so that all the input signals (ACTIVE, PONRST, X) of the NOR circuit G4 turn into "L" and the value of the output signal VppEB of the control circuit 84 turns into "H". Thus, the operational amplifier OP2 becomes inoperative and the MOS transistor QP6 is turned off.

As a result, the first potential generator 61a becomes inoperative and only the second potential generator 61b becomes operative.

Thereafter, if the external address signals ADDi are changed again and the signal ACTIVE turns into "H", then the value of the output signal VppEB of the control circuit 84 turns into "L" and the first potential generator 61a becomes operative. Further, if the external address signals ADDi are changed before the signal ACTIVE turns into "L", the state of the potential generating circuit 62 naturally does not turn into the standby state and remain in the active state (ACTIVE="H").

As described above, according to the flash memory comprising the potential generating circuit of the present invention, while the potential generating circuit is in the active state in the read mode, both the first and second potential generators 61a and 61b are operative. Thus, if the potential of the output node N of the potential generating circuit 62 is lower than the read potential Vread, the potential can be promptly boosted to the read potential Vread by the first potential generator 61a having strong driving force.

Further, while the potential generating circuit is in the standby state, if the potential of the output node N of the potential generating circuit 62 is substantially equal to the read potential Vread, the first potential generator 61a is inoperative. Thus, the potential of the output node N of the potential generating circuit 62 can be maintained to be the read potential Vread by the second potential generator 61b having small driving force. On the other hand, even in the standby state, if the potential of the output node N of the potential generating circuit 62 is lower than the read potential Vread, the first and second potential generators 61a and 61b are made operative and the potential of the output node N of the potential generating circuit 62 can be promptly boosted to the read potential Vread by the first potential generator 61a having strong driving force.

Figure 32:
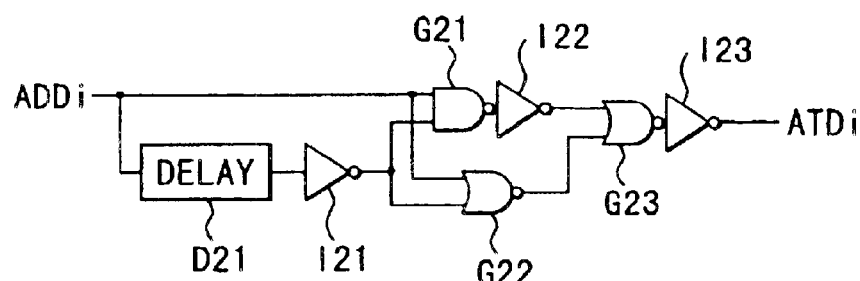
FIG. 32 shows an example of a part of an ATD circuit.
Figure 33:
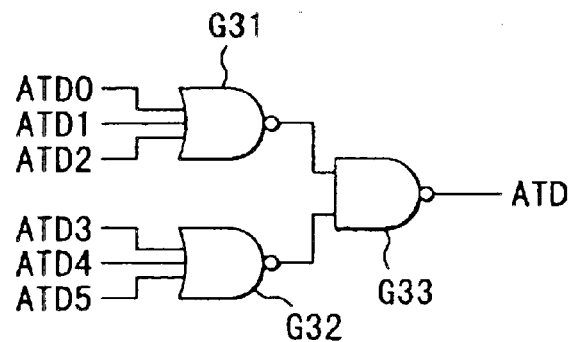
FIG. 33 shows an example of another part of the ATD circuit.

FIGS. 32 and 33 show an example of the ATD circuit 63 shown in FIG. 29.

In this example, the ATD circuit consists of two sections.

The first section is a circuit for detecting the one-bit change of external address signals ADDi consisting of a plurality of bits. This circuit is that shown in FIG. 32 and the number of the circuits provided therein corresponds to that of bits of the external address signals ADDi. For brevity, if it is assumed that the external address signals consist of, for example, six bits (i=0, 1, ..., 5), that is, ADD0, ADD1, ..., ADD5, six circuits shown in FIG. 32 exist.

The circuit of FIG. 32 consists of a delay circuit D21, an NAND circuit G21, NOR circuits G22 and G23, and inverters I21, I22 and I23. If the external address signals ADDi are changed by one bit, this circuit detects the change of the signals ADDi and outputs pulse signals ATDi (i=0, 1, ..., 5). The pulse width of the pulse signal ATDi is determined by the delay amount of the delay circuit D21.

The second section is a circuit for outputting a pulse signal ATD when at least one bit of the external address signals ADDi consisting of a plurality of bits is changed. This circuit is that shown in FIG. 33 and only one circuit is provided.

The circuit of FIG. 33 consists of NOR circuits G31 and G32, and an NAND circuit G33. The signals ATDi (i=0, 1, ..., 5) are usually "L" and the signal ATD is also "L". If at least one of the signals ATDi turns into "H", the signal ATD turns into "H", as well. Namely, if at least one bit of the external address signals ADDi consisting of a plurality of bits is changed, at least one of signals ATDi turns into "H" (pulse signal) and the pulse signal ATD is outputted from the circuit shown in FIG. 33.

Figure 34:
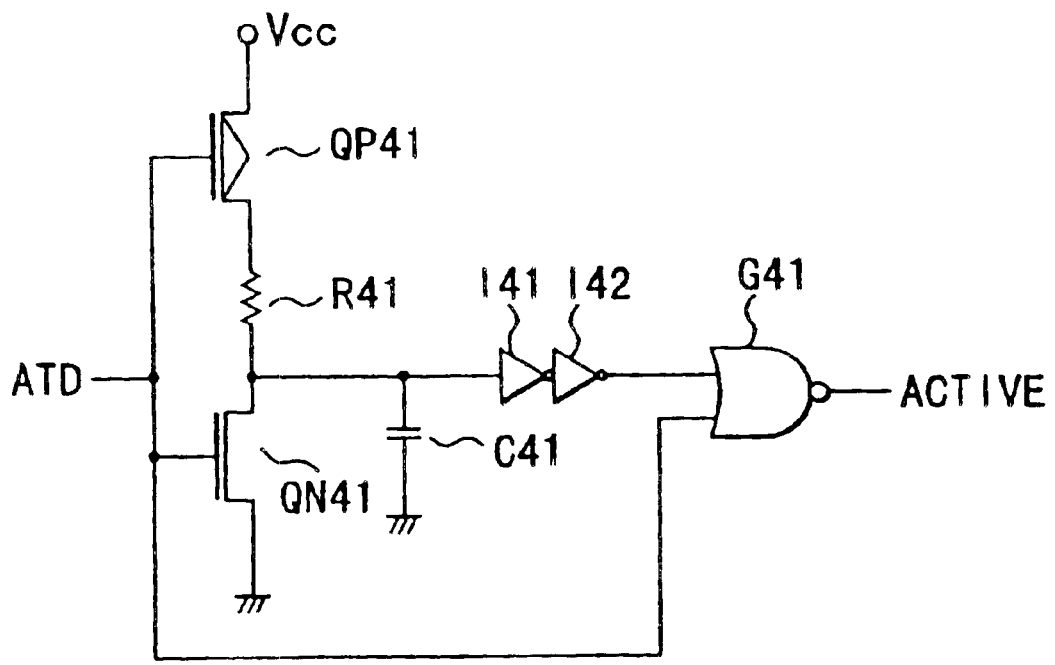
FIG. 34 shows an example of a pulse generating circuit.

FIG. 34 shows an example of the pulse generating circuit 53 shown in FIG. 29.

The pulse generating circuit inputs the pulse signal ATD and outputs a pulse signal ACTIVE. The pulse generating circuit consists of MOS transistors QP41 and QN41 connected in series between the power supply Vcc terminal and a ground terminal, a resistor R41, a capacitor C41, an NOR circuit G41, and inverters I41 and I42.

First, if the signal ATD turns into "H", the MOS transistor QN41 is turned on and the charge of the capacitor C41 is discharged to the ground terminal and the pulse generating circuit is reset (ACTIVE="L"). Thereafter, if the signal ATD turns into "L", both the two input signals of the NOR circuit G41 turn into "L" and the output signal ACTIVE instantly turns into "H".

Meanwhile, since the MOS transistor QN41 is turned off and the MOS transistor QP41 is turned on, charge is injected into the capacitor C41 from the power supply Vcc terminal. When a delay time determined by the resistance value of the resistor R41 and the capacity value of the capacity C41 passes, the input signal of the inverter I41 turns from "L" to "H". Accordingly, one of the input signals of the NOR circuit G41 turns into "H" and the output signal ACTIVE turns into "L".

That is to say, as the signal ATD changes from "H" to "L", the pulse signal ACTIVE having a pulse width determined by the resistance value of the resistor R41 and the capacity value of the capacitor C41 is outputted from the pulse generating circuit shown in FIG. 34.

Figure 35:
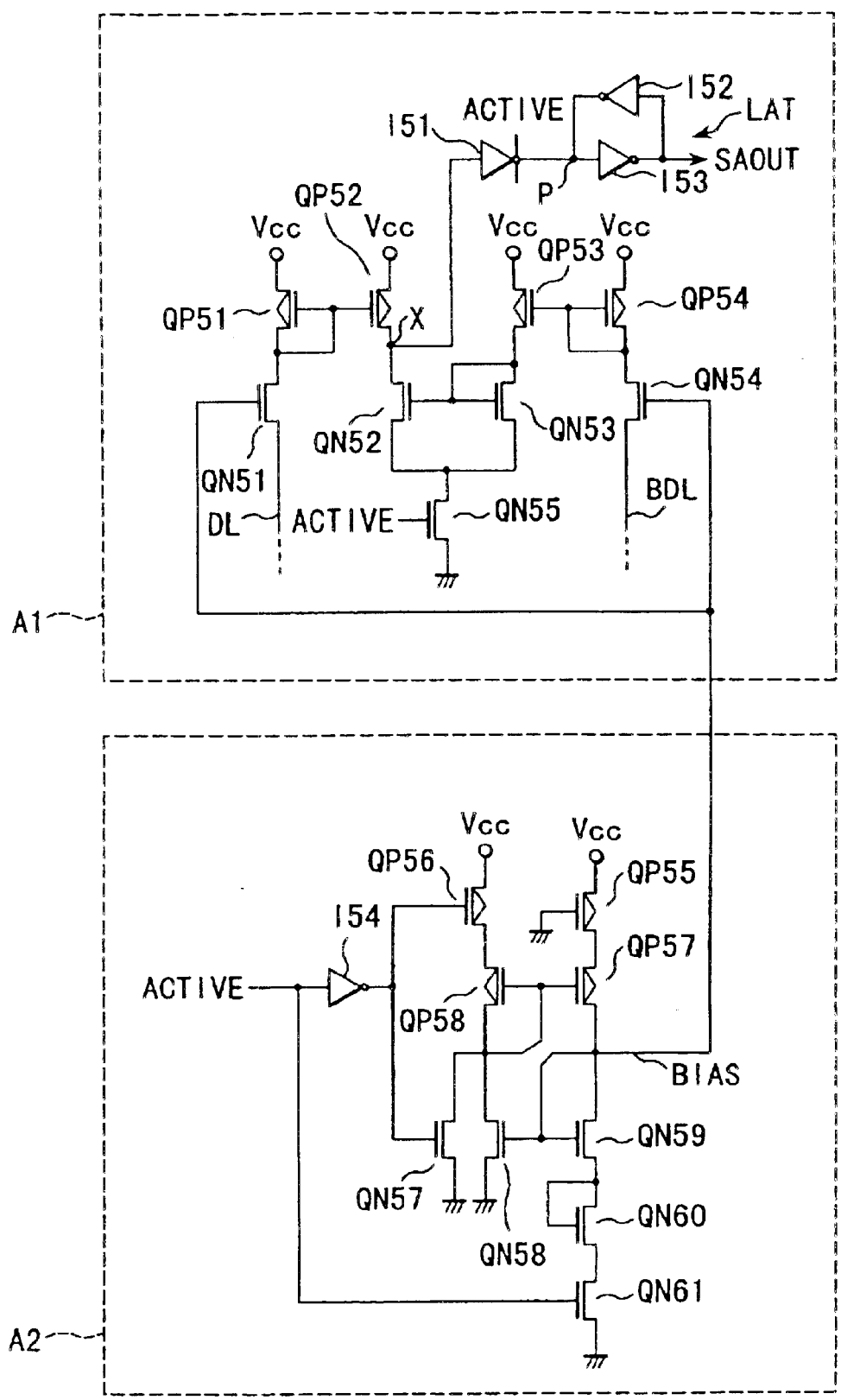
FIG. 35 shows an example of a sense amplifier.

FIG. 35 shows an example of the sense amplifier 59 shown in FIG. 29.

The sense amplifier in this example consists of a sense amplifier section A1 and a bias generating section A2.

The sense amplifier section A1 consists of P channel type MOS transistors QP51, QP52, QP53 and QP54, N channel type MOS transistors QN51, QN52, QN53, QN54 and QN55, a clocked inverter I51, and inverters I52 and I53.

The MOS transistors QP51, QP52, QN51 and QN52 constitute a differential amplifier. The MOS transistors QP53, QP54, QN53 and QN54 also constitute a differential amplifier. Further, the inverters I52 and I53 constitute a latch circuit LAT. Paired data lines DL and BDL are connected to paired bit lines, respectively, through, for example, a buffer.

If the signal ACTIVE turns into "H", the MOS transistor QN55 is turned on and the two differential amplifiers become operative. Also, if the signal ACTIVE turns into "H", the clocked inverter I51 becomes operative. The data of a memory cell is inputted to the sense amplifier section A1 by way of the paired data lines DL and BDL. If the memory cell data is, for example, "1", the paired data lines DL and BDL become DL="L" and BDL="H" and the output node X of the differential amplifier turns into "H". Due to this, the latch circuit LAT latches data "1" (while a node P is "L") and the output signal SAOUT turns into "H". Further, if the memory cell data is "0", the paired data lines DL and BDL become DL="H" and BDL="L" and the output node X of the differential amplifier circuit turns into "L". Thus, the latch circuit LAT latches data "0" (while the node P is "H") and the output signal SAOUT turns into "L".

The bias generating section A2 consists of P channel type MOS transistors QP55, QP56, QP57 and QP58, N channel type MOS transistors QN57, QN58, QN59, QN60 and QN61, and an inverter I54. The bias generating section A2 functions to output an intermediate potential BIAS when the signal ACTIVE is "H". This intermediate potential BIAS is inputted to the gate of the MOS transistor QN54 of the sense amplifier section A1.

Figure 36:
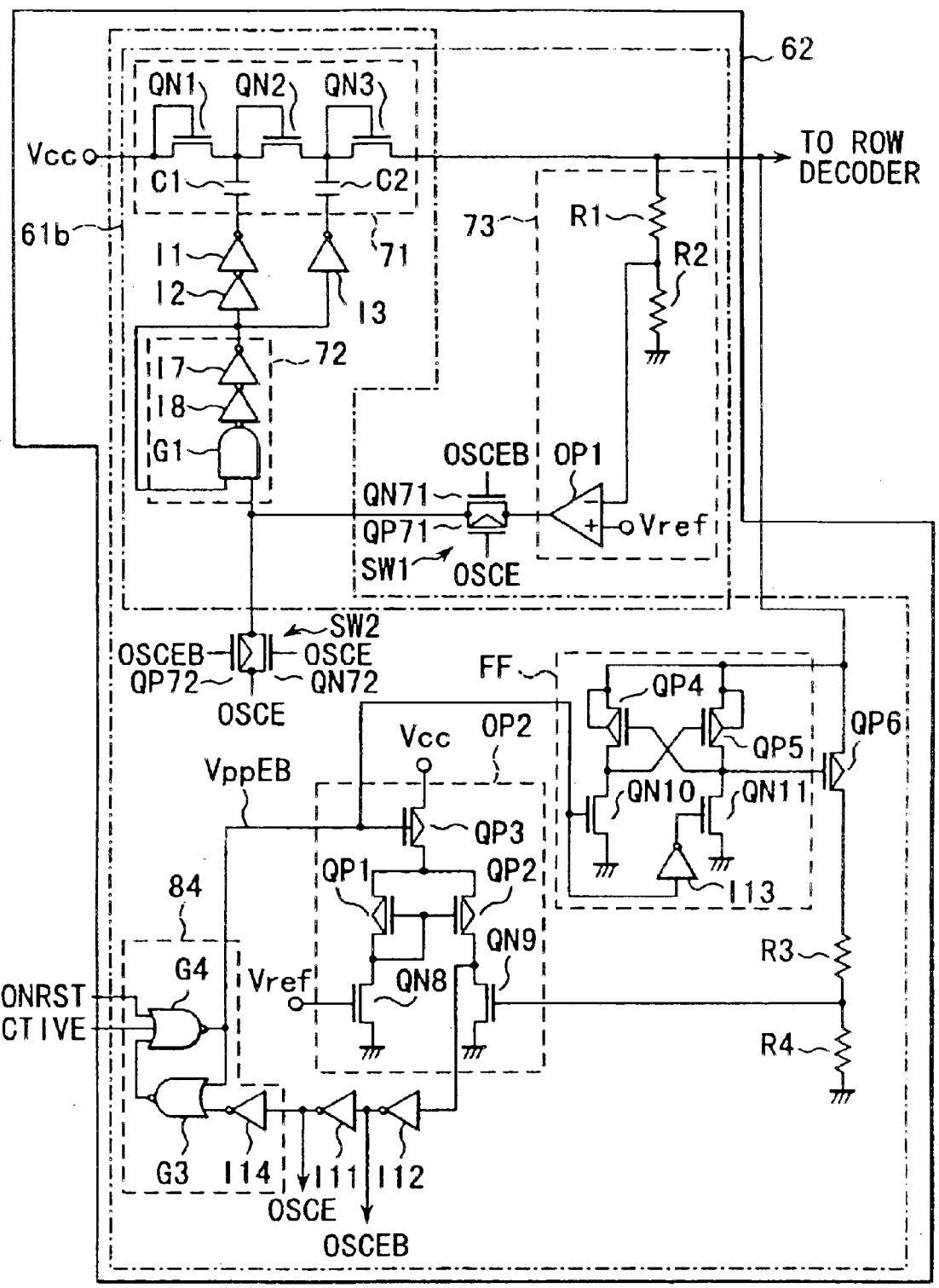
FIG. 36 shows a modified example of the potential generating circuit shown in FIG. 30.

FIG. 36 shows a modified example of the potential generating circuit 62 shown in FIG. 30.

The potential generating circuit in this example is characterized in that either the booster 81 and the oscillator 82 of the first potential generator 61a shown in FIG. 30 or the booster 71 and the oscillator 72 of the second potential generator 61b shown in FIG. 30 are omitted and that the first and second potential generators 61a and 61b share one booster and one oscillator between them.

It is noted that the same constituent elements in the potential generating circuit in this example as those in the potential generating circuit shown in FIG. 30 are denoted by the same reference symbols.

In the potential generating circuit 62 in this example, two new switch circuits (transfer gates) SW1 and SW2 are provided. Among them, one is a switch circuit SW1 consisting of a P channel type MOS transistor QP71 and an N channel type MOS transistor QN71. The switch circuit SW1 is connected between the output node of an operational amplifier OP1 and the input node of an oscillator 72. The other switch is a switch circuit SW2 consisting of a P channel type MOS transistor QP72 and an N channel type MOS transistor QN72. The switch circuit SW2 is connected between the output node of an inverter I11 and the input node of the oscillator 72.

In this example, when the first potential generator 61a is operative, that is, an signal OSCE is "H", the switch circuit SW2 consisting of the MOS transistors QP72 and QN72 is turned on and the switch circuit SW1 consisting of the MOS transistors QP71 and QN71 is turned off. When the first potential generator 61a is inoperative, that is, the signal OSCE is "L", the switch circuit SW1 consisting of the MOS transistors QP71 and QN71 is turned on the switch circuit SW2 consisting of the MOS transistors QP72 and QN72 are turned off.

In other words, the switch circuits SW1 and SW2 are on/off-controlled based on the state of the first potential generator 61a.

In the above-stated embodiment, description has been given while taking an NOR type flash memory as an example. The present invention is also applicable to a memory necessary to apply a selected word line with a potential Vread higher than a power supply potential Vcc in a real mode in which an active state and a standby state are repeated, e.g., a multi-level NAND type flash memory.

Figure 37:
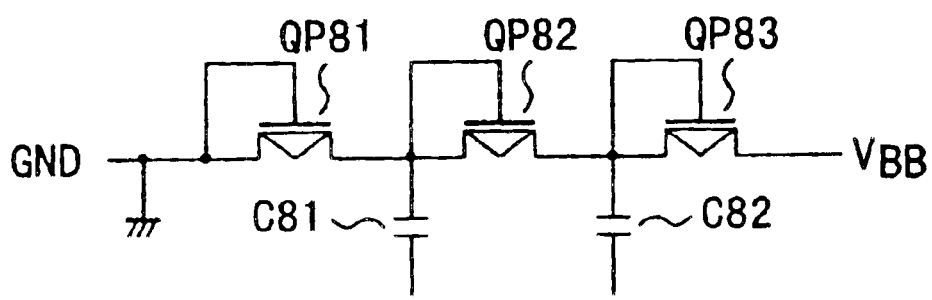
FIG. 37 shows a modified example of a booster.

Moreover, if the configuration of each of the boosters 71 and 81 shown in FIGS. 30 and 36 is changed to that shown in FIG. 37, the present invention is applicable to a case where a read potential is set at a negative potential in a read mode.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
   a control circuit which outputs a control signal during a program verify operation;
   a potential generating circuit which generates one of a first program verify threshold value and a second program verify threshold value higher than the first program verify threshold value based on the control signal; and
   a verify circuit which determines a data value of data read from a memory cell using one of the first and second program verify threshold values as a read potential, compares the data value with an expected value, and determines whether data programming is completed.

2. The nonvolatile semiconductor memory according to claim 1, wherein if the potential generating circuit generates the second program verify threshold value, a lower limit of a threshold voltage distribution after completion of the data programming is higher than the second program verify threshold value.

3. The nonvolatile semiconductor memory according to claim 1, wherein if the potential generating circuit generates the second program verify threshold value, a lower limit of a threshold voltage distribution after completion of the data programming is higher than the first program verify threshold value.

4. The nonvolatile semiconductor memory according to claim 3, wherein a difference between the first program verify threshold value and the second program verify threshold value is set to be either equal to or larger than a difference between an over-erase verify threshold value and a lower limit of the threshold voltage distribution after completion of a data erase.

5. The nonvolatile semiconductor memory according to claim 1, wherein the potential generating circuit generates the second program verify threshold value during a write/erase test for repeating write and erase operations, and the verify circuit determines the data value using the second program verify threshold value as the read potential.

6. The nonvolatile semiconductor memory according to claim 1, wherein the potential generating circuit generates the first program verify threshold value during a normal operation, and the verify circuit determines the data value using the first program verify threshold value as the read potential.

7. The nonvolatile semiconductor memory according to claim 1, wherein the potential generating circuit comprises:
   resistors connected in series between an output node and a first power source node;
   an operational amplifier circuit which equalizes a potential of one of a plurality of connecting points of the resistors with a reference potential, and
   a logic circuit which directly connects one of the connecting points of the resistors with the first power source node based on the control signal.

8. The nonvolatile semiconductor memory according to claim 7, wherein a potential of the output node when one of the connecting points of the resistors connects to the first power source node is higher than a potential of the output node when none of the connecting points of the resistors connects to the first power source node.

9. The nonvolatile semiconductor memory according to claim 7, wherein the first and second program verify threshold values are outputted to the output node.

10. The nonvolatile semiconductor memory according to claim 7, wherein the operational amplifier circuit comprises:
    a P channel MOS transistor connected between a second power source node and the output node;
    a first operational amplifier which controls a gate potential of the P channel MOS transistor based on a reference potential and a potential of one of the connecting points of the resistors;
    an N channel MOS transistor connected between the first power source node and the output node; and
    a second operational amplifier which controls a gate potential of the N channel MOS transistor based on the reference potential and the potential of the one of the connecting points of the resistors.

11. The nonvolatile semiconductor memory according to claim 10, wherein a boosted program potential is supplied with the second power source node.

* * * * *